US006296985B1

United States Patent
Mizutani et al.

(10) Patent No.: US 6,296,985 B1
(45) Date of Patent: Oct. 2, 2001

(54) POSITIVE PHOTORESIST COMPOSITION COMPRISING A POLYSILOXANE

(75) Inventors: Kazuyoshi Mizutani; Shoichiro Yasunami, both of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/496,259

(22) Filed: Feb. 1, 2000

(30) Foreign Application Priority Data

Feb. 1, 1999 (JP) ................................................ 11-24236

(51) Int. Cl.[7] ................................ G03F 7/004; C08J 3/28
(52) U.S. Cl. ........................................ 430/270.1; 522/148
(58) Field of Search ........................ 430/270.1, 272.1; 522/148

(56) References Cited

U.S. PATENT DOCUMENTS 5,338,818 * 8/1994 Brunsvold et al. ..................... 528/43
5,612,170   3/1997 Takemura et al. ................. 430/270.1
5,691,396   11/1997 Takemura et al. ....................... 522/62
5,882,844 * 3/1999 Tsuchiya et al. ................. 430/288.1
6,087,064 * 7/2000 Lin et al. ........................... 430/270.1

* cited by examiner

Primary Examiner—Rosemary E. Ashton
(74) Attorney, Agent, or Firm—Sughrue, Mion, Zinn, Macpeak & Seas, PLLC

(57) ABSTRACT

A positive photoresist composition comprising (a) an acid-decomposable polysiloxane having a structural unit represented by formula (IV):

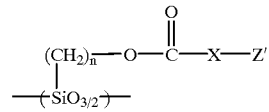

(IV)

wherein Z' is a phenyl ring substituted with an acid-decomposable group and (b) a compound which decomposes upon exposure to generate an acid.

2 Claims, No Drawings

POSITIVE PHOTORESIST COMPOSITION COMPRISING A POLYSILOXANE

FIELD OF THE INVENTION

The present invention relates to a positive photoresist composition which is used in the production of an integrated circuit element of a semiconductor, a mask for producing an integrated circuit, a printed board, and a liquid crystal panel.

BACKGROUND OF THE INVENTION

Methods of utilizing photoresists which are sensitive to ultraviolet rays or visible rays have been conventionally widely put to practical use in pattern forming for producing electronic parts such as semiconductor elements, magnetic bubble memories, integrated circuits, etc. Photoresists are classified into two types of a negative type in which the part irradiated with light becomes insoluble in a developing solution, and a positive type in which the irradiated part becomes soluble in a developing solution contrary to the negative type. As the negative type photoresist is excellent in sensitivity, the adhesive property with substrates requisite in wet etching and chemical resistance as compared with the positive type, the negative type has stood first in the photoresist until recently.

However, the line widths and intervals of resist patterns have become extremely fine with the trend of higher density and higher integration of semiconductor elements, etc., and dry etching has come to be adopted in the etching of substrates, as a result, the photoresist is required to have higher resolving degree and higher resistance against dry etching. For these reasons, the positive photoresist accounts for mainstream at present. In particular, because of high sensitivity, high resolving degree and excellent dry etching resistance, among the positive photoresists, alkali development type positive photoresists based on alkali-soluble novolak resins described, for example, in J. C. Strieter, *Kodak Microelectronics Seminar Proceedings*, p. 116 (1976) have now become mainstream.

With the tendency of multifunction and high advancement of electronic equipments in recent years, however, refinement of patterns has been eagerly demanded for further increase in density and integration.

As the dimension of the IC in the machine direction cannot be so reduced as compared with the reduction in the transverse direction, the ratio of the height to the width of the resist pattern cannot be helped to become larger. Therefore, it has become more and more difficult to suppress dimensional changes of resist patterns on the wafers having complicated structural differences in level with the progress of refinement of patterns.

Further, problems have also arisen in various exposing methods with the contraction of the lower limit. For example, in exposure with a light, the interference action of the reflected light due to difference in level of the substrate largely affects dimensional accuracy. On the other hand, in exposure with an electron beam, the ratio of the height to the width of a refined resist pattern cannot be increased by the proximity effect caused by the back scattering of the electron.

It has been found that these many problems can be resolved by employing a multilayer resist system. With respect to a multilayer resist system, a general statement is described in *Solid State Technology*, 74 (1981), and other many studies have been disclosed as to the multilayer resist system.

In general, the multilayer resist system is classified into a three-layer resist system and a two-layer resist system. The three-layer resist system is a system comprising coating an organic flattened layer on a substrate with differences in level, laminating an inorganic interlayer and a resist thereon, patterning the resist, dry etching the inorganic interlayer with making the resist a mask, and patterning an organic flattened layer by $O_2$ RIE (reactive ion etching) with making the inorganic interlayer a mask. This system has been discussed from early as conventional techniques can be fundamentally used but there arise such problems that the process is very complicated, or cracks and pinholes are liable to be generated in the interlayer because three layers, i.e., an organic layer, an inorganic layer, an organic layer, each having different physical properties are superposed.

Contrary to the three-layer resist system, a resist having both properties of the resist and the inorganic interlayer in the three-layer resist system, i.e., a resist having oxygen plasma resistance, is used in the two-layer resist system, so that generation of cracks and pinholes can be prevented and, further, process is simplified from three layers to two layers. However, contrary to the three-layer resist system wherein conventional resists can be used, there is such a subject in the two-layer resist system that a novel resist having oxygen plasma resistance has to be developed.

From the above-described background, the development of a positive photoresist which can be used as the upper layer resist in the two-layer resist system and having excellent oxygen plasma resistance, high sensitivity and high resolution, in particular, an alkali development type positive photoresist which can be used without modifying the present process has been desired.

For the above development, various photosensitive compositions have been suggested such as polysiloxanes comprising conventional orthoquinonediazides provided with alkali solubility, or photosensitive compositions comprising silicon polymers such as polysilmethylene, etc., in combination, e.g., photosensitive compositions disclosed in JP-A-61-144639 (the term "JP-A" as used herein means an "unexamined published Japanese patent application"), JP-A-61-256347, JP-A-62-159141, JP-A-62-191849, JP-A-62-220949, JP-A-62-229136, JP-A-63-90534, JP-A-63-91654, and U.S. Pat. No. 4,722,881, and photosensitive compositions comprising polysiloxane/carbonate block copolymers combined with an effective amount of onium salts disclosed in JP-A-62-136638.

However, alkali solubility of any of these silicon polymers is given by the introduction of a phenolic OH group or a silanol group ($\equiv$Si—OH). When alkali solubility is given by the introduction of a phenolic OH group, the production is extremely difficult, and when alkali solubility is given by a silanol group, the stability with the lapse of time is not necessarily good, or the layer thickness after development extremely decreases and a rectangular shape cannot be obtained.

Photoresists containing a polysiloxane which has in the molecule a group decomposable by the action of an acid are disclosed in U.S. Pat. No. 2,736,939 and JP-A-9-274319. However, these photoresists have various problems that the resolution is low, a rectangular form cannot be formed, and show considerable dimensional shift at the time of pattern transfer to the lower layer in the subsequent oxygen plasma process.

SUMMARY OF THE INVENTION

An object of the present invention is to provide a positive photoresist composition which can give a photoresist having high sensitivity, the resolving power of 0.2 μm or less, and a rectangular shape in a semiconductor device production.

Another object of the present invention is to provide a positive photoresist composition which causes less dimensional shift at the time of pattern transfer to the lower layer in the oxygen plasma etching process when used as the resist of the upper layer in the two-layer resist system.

A further object of the present invention is to provide a polysiloxane which can give the above excellent properties to the positive photoresist composition.

The above objects of the present invention have been achieved by the polysiloxane and positive photoresist composition as described below.

(1) An alkali-soluble polysiloxane containing a structural unit represented by the following formula (I):

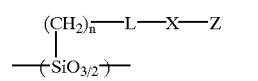

(I)

wherein n represents an integer of from 1 to 6; L represents a divalent linking group selected from the group consisting of —A—OCO—, —A—COO—, —A—NHCO—, —A—NHCOO—, —A—NHCONH—, —A—CONH—, —A—OCONH—, —A—CONHCO— and —A—S—; A represents a single bond or an arylene group; X represents a single bond or a divalent linking group; and Z represents a monovalent group selected from the group consisting of the groups represented by the following formula (II-1) or (II-2):

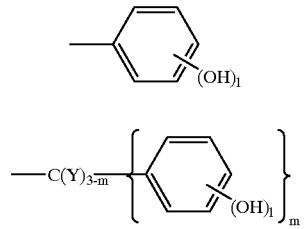

(II-1)

(II-2)

wherein Y represents a hydrogen atom, a straight chain, branched or cyclic alkyl group, an aryl group, or an aralkyl group; l represents an integer of from 1 to 3; and m represents an integer of from 1 to 3.

(2) An acid-decomposable polysiloxane wherein at least a part of the phenolic hydroxyl group of the alkali-soluble polysiloxane containing a structural unit represented by formula (I) is protected by an acid-decomposable group.

(3) An acid-decomposable polysiloxane containing a structural unit represented by the following formula (III) and a structural unit represented by the following formula (IV):

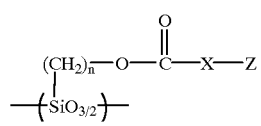

(III)

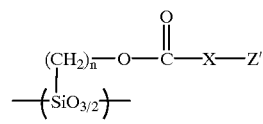

(IV)

wherein n represents an integer of from 1 to 6; X represents a single bond or a divalent linking group; and Z represents a monovalent group selected from the group consisting of the groups represented by the following formula (II-1) or (II-2):

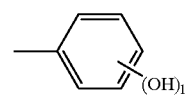

(II-1)

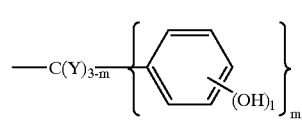

(II-2)

wherein Y represents a hydrogen atom, a straight chain, branched or cyclic alkyl group, an aryl group, or an aralkyl group; l represents an integer of from 1 to 3; and m represents an integer of from 1 to 3; Z' represents a monovalent group selected from the group consisting of the groups represented by the following formula (V-1) or (V-2):

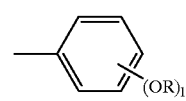

(V-1)

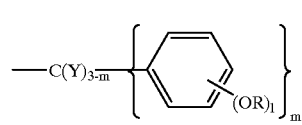

(V-2)

wherein R represents an acid-decomposable group; Y represents a hydrogen atom, a straight chain, branched or cyclic alkyl group, an aryl group, or an aralkyl group; l represents an integer of from 1 to 3; and m represents an integer of from 1 to 3.

(4) A positive photoresist composition comprising (a) an acid-decomposable polysiloxane having a structural unit represented by formula (IV), and (b) a compound which is decomposed by exposure to generate an acid.

(5) The positive photoresist composition as described in the above item (4), which further contains (c) (c1) a phenolic compound having in the molecule a phenolic hydroxyl group at least a part of which is protected by an acid-decomposable group, or (c2) an aromatic or aliphatic carboxylic acid compound having in the molecule a carboxyl group at least a part of which is protected by an acid-decomposable group.

(6) An alkali-soluble polysiloxane which contains a structural unit represented by the following formula (III):

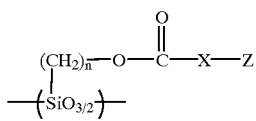

(III)

wherein n represents an integer of from 1 to 6; X represents a single bond or a divalent linking group; and Z represents a monovalent group selected from the group consisting of the groups represented by the following formula (II-1) or (II-2):

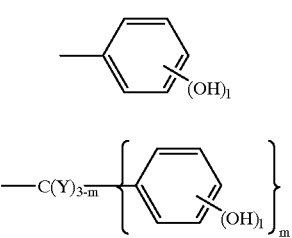

(II-1)

(II-2)

wherein Y represents a hydrogen atom, a straight chain, branched or cyclic alkyl group, an aryl group, or an aralkyl group; 1 represents an integer of from 1 to 3; and m represents an integer of from 1 to 3.

(7) A positive photoresist composition which contains (a) the alkali-soluble polysiloxane as described in the above item (6), (b) a compound which is decomposed by exposure to generate an acid, and (c) (c1) a phenolic compound having in the molecule a phenolic hydroxyl group at least a part of which is protected by an acid-decomposable group, or (c2) an aromatic or aliphatic carboxylic acid compound having in the molecule a carboxyl group at least a part of which is protected by an acid-decomposable group.

DETAILED DESCRIPTION OF THE INVENTION

The polysiloxane according to the present invention will be described in the first place.

In formula (I), L represents a divalent linking group selected from the group consisting of —A—OCO—, —A—COO—, —A—NHCO—, —A—NHCOO—, —A—NHCONH—, —A—CONH—, —A—OCONH—, —A—CONHCO— and —A—S— (wherein A represents a single bond or an arylene group), preferably —OCO— or —C$_6$H$_4$—OCO—, and particularly preferably —OCO—.

The arylene group preferably has from 6 to 11 carbon atoms including a substituent, specifically an o-, m- or p-phenylene group which may have a substituent, and preferably a p-phenylene group or a naphthylene group.

In formulae (I), (III) and (IV), X represents a single bond or a divalent linking group. Specific examples of divalent linking groups include linking groups consisting of one kind or consisting of two or more kinds in combination selected from a straight chain alkylene group having from 1 to 6 carbon atoms, a branched alkylene group having from 1 to 6 carbon atoms, a cycloalkylene group having from 6 to 10 carbon atoms, an arylene group having from 6 to 10 carbon atoms, and an aralkylene group having from 7 to 11 carbon atoms. X may contain one or more groups selected from —O—, —CO—, —S—, —SO$_2$— and —CH=CH— between X and Z.

Preferred examples of the alkylene group include a methylene group, an ethylene group, a propylene group, and a butylene group. Preferred example of the cycloalkylene group includes a cyclohexylene group. Preferred examples of the arylene groups include a phenylene group and a naphthylene group. Preferred example of the aralkylene group includes a phenylenemethylene group.

In formulae (II-2) and (V-2), Y represents a hydrogen atom, an alkyl group, an aryl group, or an aralkyl group. The alkyl group may be any of a straight chain, branched or cyclic alkyl group. The alkyl group preferably has from 1 to 10 carbon atoms, the aryl group preferably has from 6 to 10 carbon atoms, and the aralkyl group preferably has from 7 to 11 carbon atoms.

Specific examples of Y include a hydrogen atom, a methyl group, an ethyl group, an n-propyl group, an i-propyl group, an n-butyl group, an i-butyl group, a t-butyl group, an n-pentyl group, an i-pentyl group, an n-hexyl group, a cyclohexyl group, a phenyl group, a naphthyl group, a benzyl group, a phenethyl group and a naphthylmethyl group, and particularly preferably a hydrogen atom or a methyl group.

In formulae (I), (III) and (IV), n represents an integer of from 1 to 6, preferably from 1 to 3.

In formulae (II-1), (II-3), (V-1) and (V-2), 1 represents an integer of from 1 to 3, preferably 1 or 2, and m represents an integer of from 1 to 3, preferably 1 or 2.

Examples of the acid-decomposable group, which protects the phenolic hydroxyl group of the alkali-soluble polysiloxane containing a structural unit represented by formula (I) to make the alkali-soluble polysiloxane an acid-decomposable polysiloxane, include a group represented by —CR$_1$R$_2$(OR$_3$), a t-butoxycarbonyl group, a t-butoxycarbonylmethyl group, a t-butyl group, a t-amyl group, a 1-methylcyclohexyl group, a trimethylsilyl group, and a t-butyldimethylsilyl group. R$_1$ and R$_2$, which may be the same or different, each represents a hydrogen atom or a straight chain or branched alkyl group having from 1 to 6 carbon atoms. R$_3$ represents a straight chain, branched or cyclic alkyl group having from 1 to 10 carbon atoms. R$_2$ and R$_3$ may be bonded to form a cyclic structure, preferably a 6-membered cyclic structure.

Preferred specific examples of acid-decomposable groups include a t-butoxycarbonyl group, a t-butyl group, a trimethylsilyl group, a t-butyldimethylsilyl group, and a group represented by the following formula

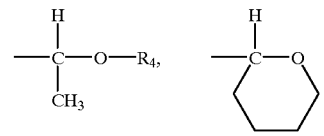

wherein R$_4$ represents a methyl group, an ethyl group, an n-propyl group, an i-propyl group, an n-butyl group, an i-butyl group or a t-butyl group.

In formulae (V-1) and (V-2), R represents the above-described acid-decomposable group, and two or more acid-decomposable groups may be combined.

The alkali-soluble polysiloxane according to the present invention preferably contains a structural unit represented by formula (I) in an amount of from 10 to 100 mol %, more preferably from 30 to 100 mol %.

The acid-decomposable polysiloxane according to the present invention preferably contains a structural unit represented by formula (I) in an amount of from 0 to 90 mol %, and a structural unit represented by formula (I) in which at least a part of the phenolic hydroxyl group is protected by an acid-decomposable group in an amount of from 10 to 100 mol %, respectively, more preferably contains the former structural unit in an amount of from 0 to 50 mol % and the latter from 50 to 100 mol %, respectively.

The acid-decomposable polysiloxane and the alkali-soluble polysiloxane according to the present invention may be co-condensed with a structural unit represented by the following formula (VI) and/or (VII) for adjusting solvent solubility and alkali solubility.

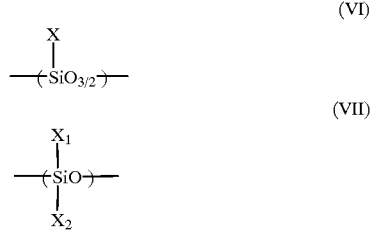

wherein X, $X_1$ and $X_2$ each represents a group which does not have alkali solubility and acid decomposability.

Examples of these groups include a straight chain alkyl group having from 1 to 10 carbon atoms which may have a substituent, a branched alkyl group having from 3 to 10 carbon atoms which may have a substituent, a cyclic alkyl group having from 6 to 10 carbon atoms which may have a substituent, an aryl group having from 6 to 10 carbon atoms which may have a substituent, and an aralkyl group having from 7 to 11 carbon atoms which may have a substituent.

Preferred specific examples include methyl, ethyl, n-propyl, i-propyl, n-butyl, i-butyl, t-butyl, n-pentyl, n-hexyl, n-heptyl, n-octyl, n-nonyl, n-decyl, cyclohexyl, phenyl, naphthyl, benzyl, and naphthylmethyl.

As the substituents of these groups, a halogen atom, an alkoxyl group having from 1 to 6 carbon atoms, a phenoxy group and a hydroxyl group can be exemplified.

$X_1$ and $X_2$ may be the same or different.

When L represents —OCO— (that is, when formula (I) represents formula (III)), the alkali-soluble polysiloxane containing a structural unit represented by formula (I) can be obtained by reacting (chloroalkyl)trialkoxysilane with a carboxylic acid compound having phenol structure at terminals in the presence of a basic catalyst (salts such as potassium iodide may be added at this time in order to accelerate the reaction), adding a mono-substituted trialkoxysilane or a di-substituted dialkoxysilane for providing a structural unit represented by formula (VI) and/or (VII), if desired, and then performing condensation polymerization in the presence of water and an acid, or water and a base. It can also be obtained by reacting a carboxylic acid compound having phenol structure at terminals in the same manner after condensation polymerization of the alkoxysilane.

When L represents —COO—, —NHCO—, —NHCOO—, —NHCONH—, —CONH—, —OCONH—, —CONHCO— or —S—, the alkali-soluble polysiloxane containing a structural unit represented by formula (I) can be obtained by utilizing trialkoxysilanes each having a carboxyl group, an amino group or a mercapto group at terminals.

The acid-decomposable polysiloxane can be obtained by well-known reactions, e.g., an acid catalytic reaction of the above-described alkali-soluble polysiloxane with a vinyl ether compound corresponding to the acid-decomposable group, or a basic catalytic reaction of the above-described alkali-soluble polysiloxane with di-t-butyl dicarbonate, trimethylsilyl chloride or t-butyldimethylsilyl chloride, etc.

Specific examples of the structural units of the polysiloxane according to the present invention, i.e., an alkali-soluble polysiloxane and an acid-decomposable polysiloxane, are shown below, but the present invention is not limited thereto.

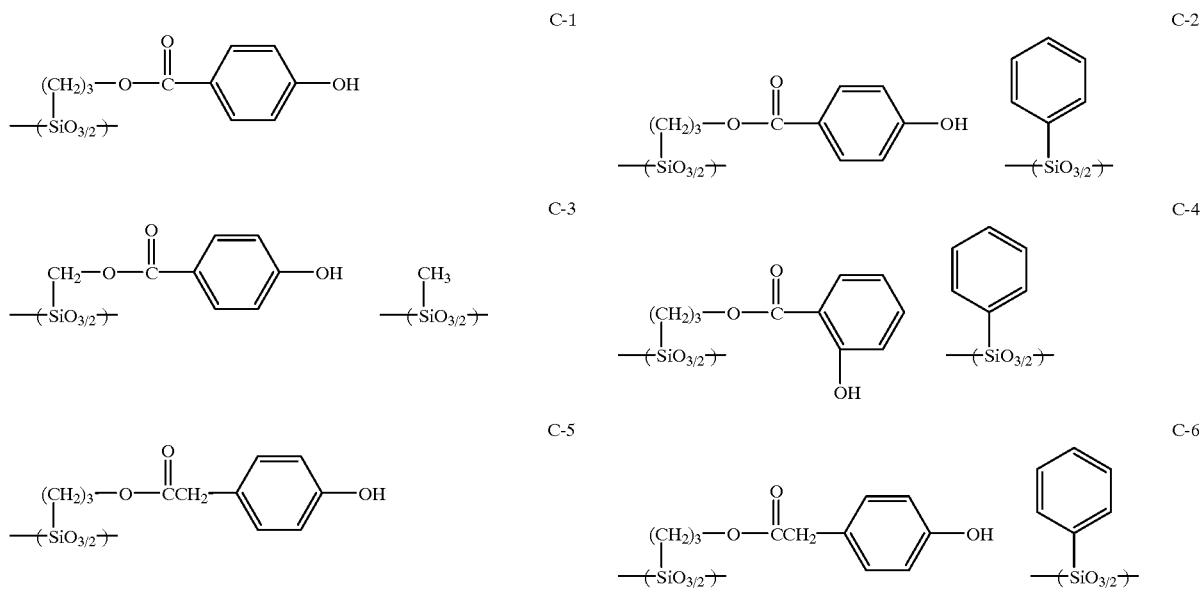

-continued
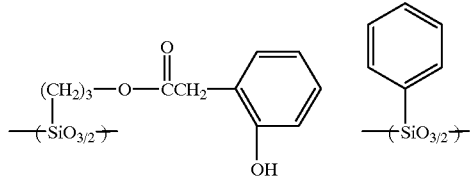
C-7
C-8
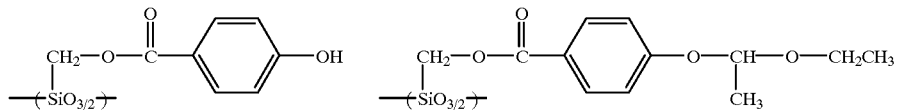
C-9
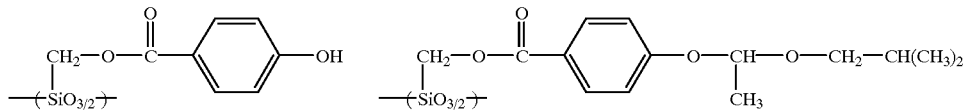
C-10
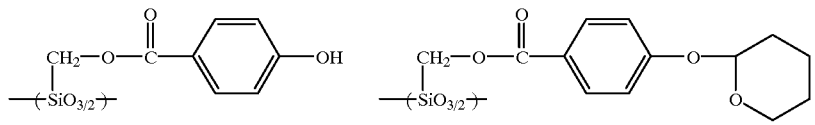
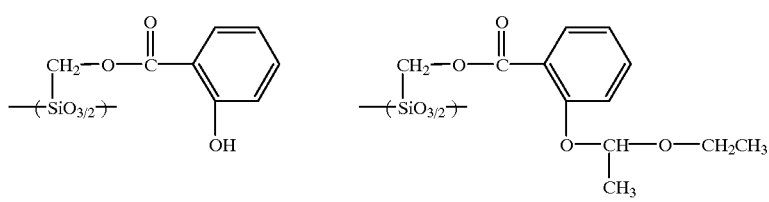
C-11
C-12
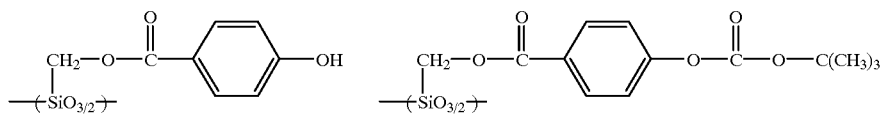
C-13
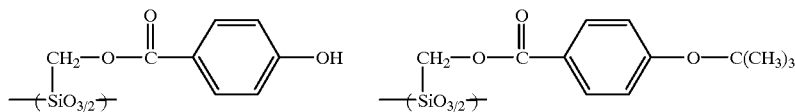
C-14
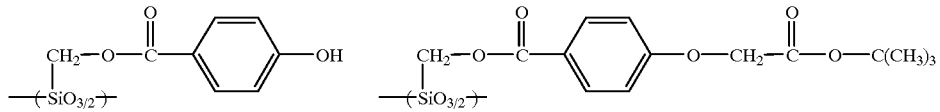
C-15
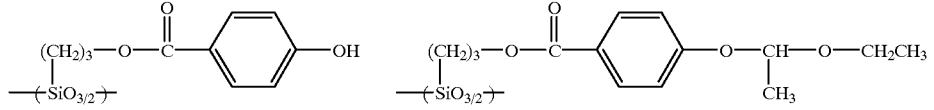
C-16
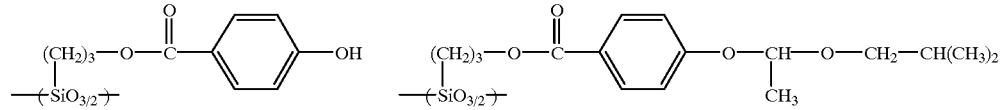
C-17
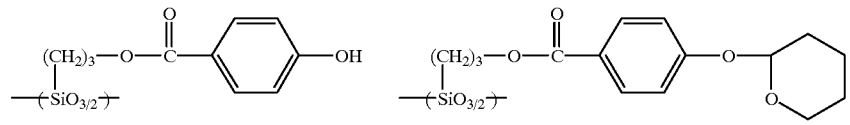

-continued

-continued
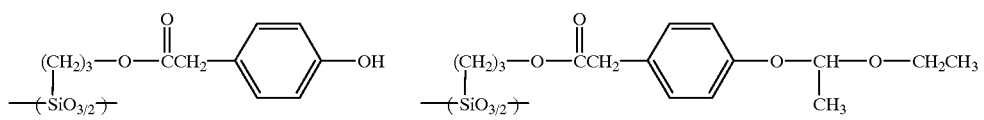
C-29
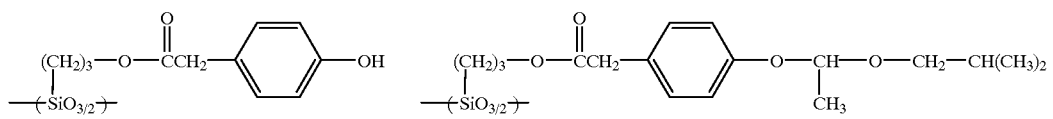
C-30
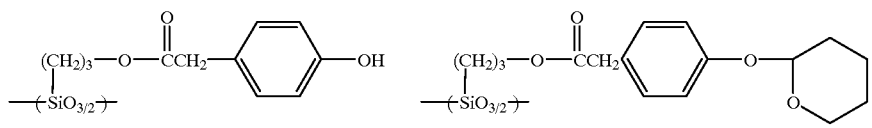
C-31
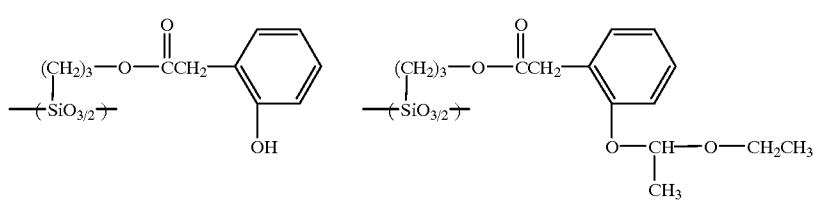
C-32
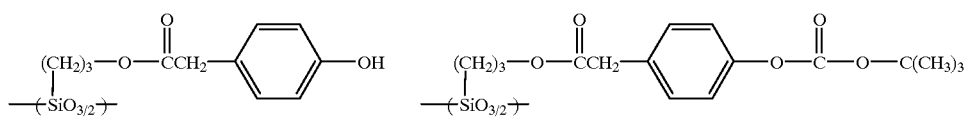
C-33
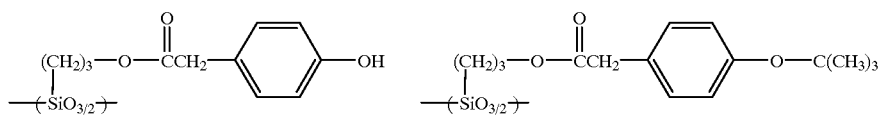
C-34
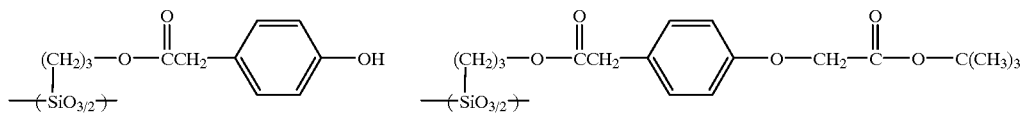
C-35
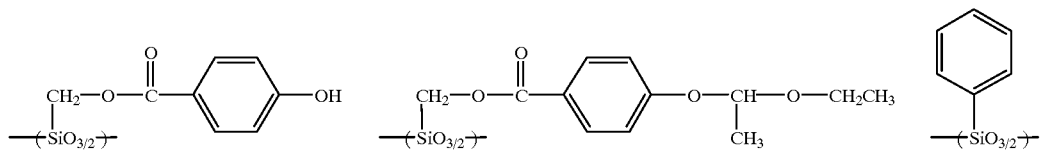
C-36
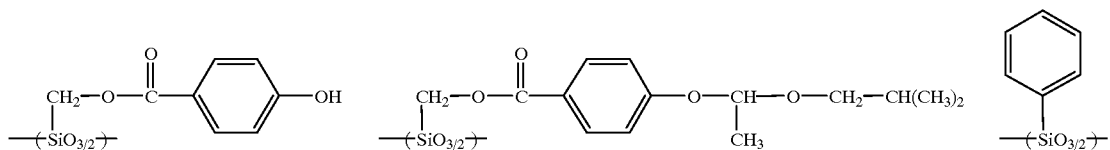
C-37
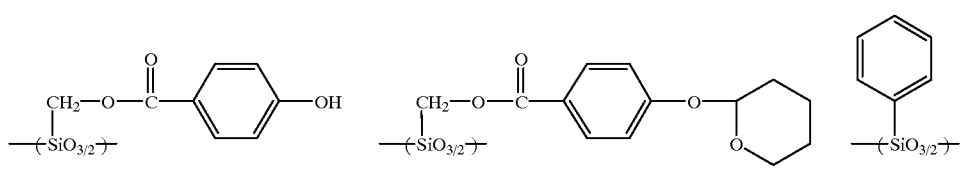
C-38

-continued
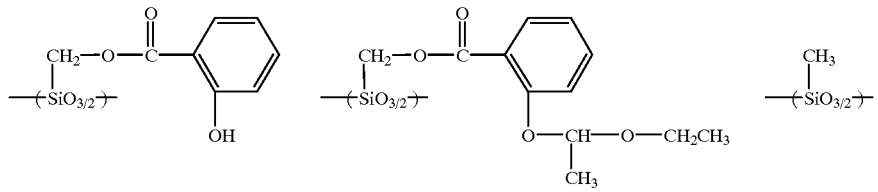
C-39
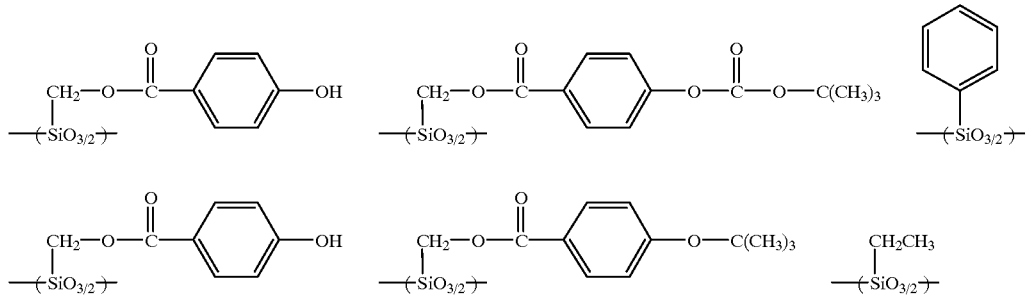
C-40
C-41
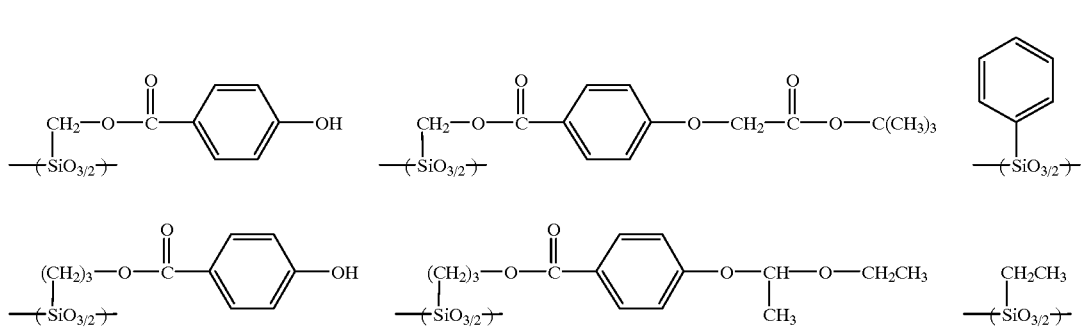
C-42
C-43
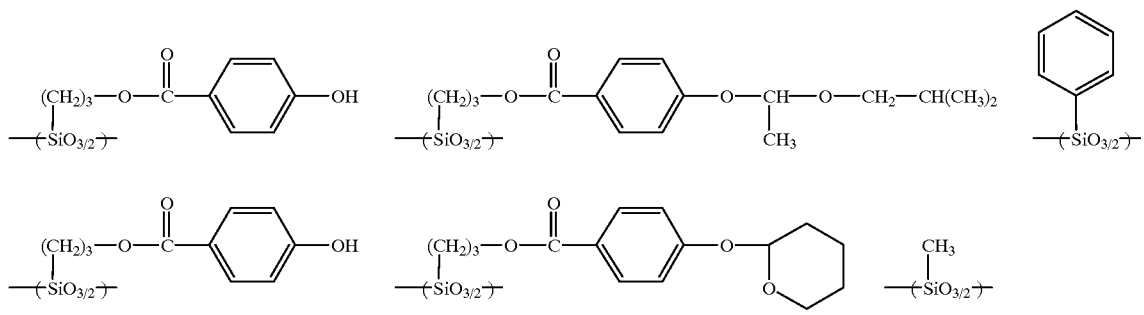
C-44
C-45
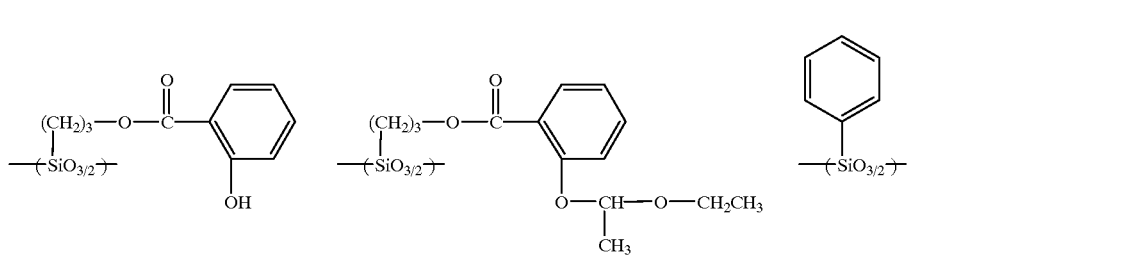
C-46
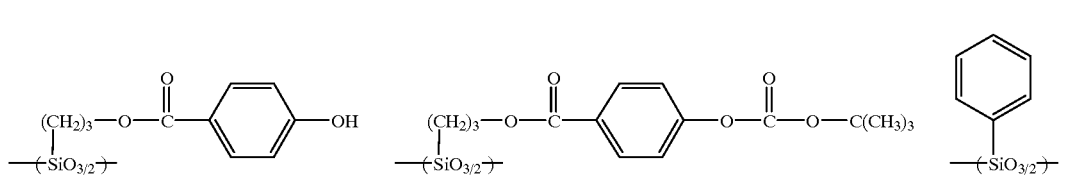
C-47

C-48
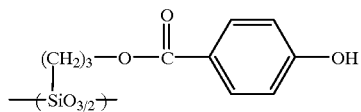 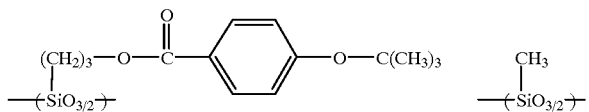
C-49
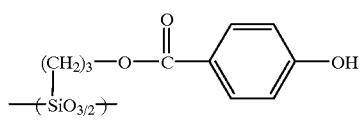 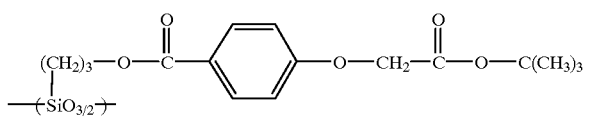 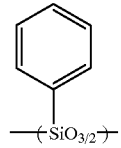
C-50
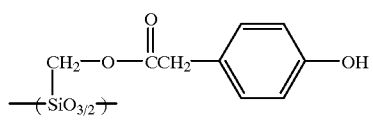 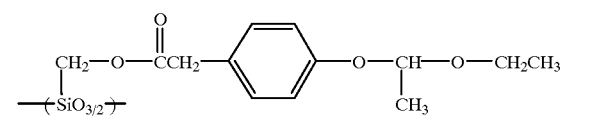 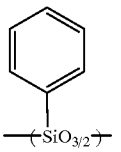
C-51
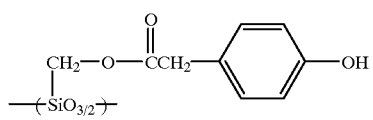 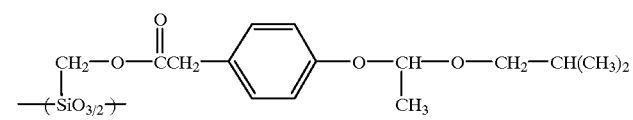 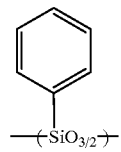
C-52
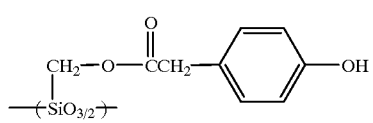 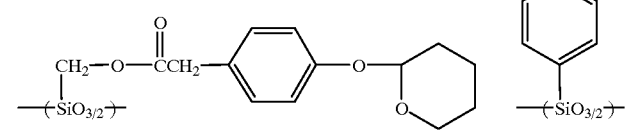 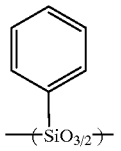
C-53
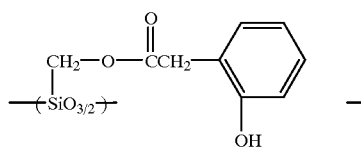 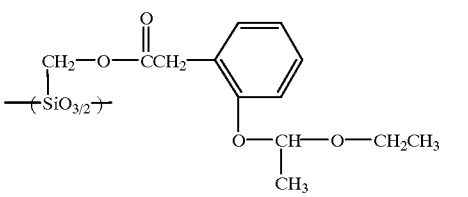 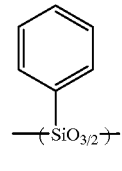
C-54
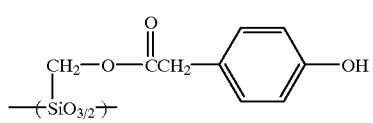 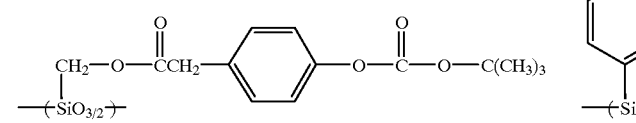 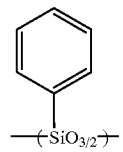
C-55
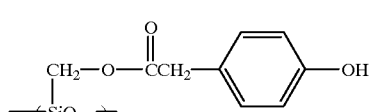 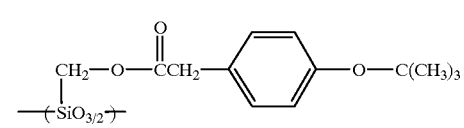 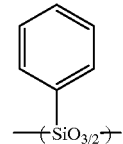
C-56
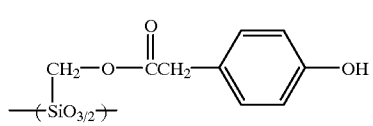 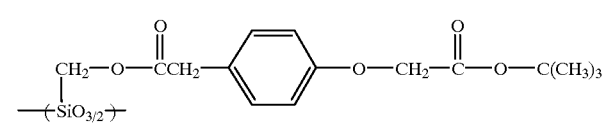 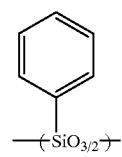

-continued
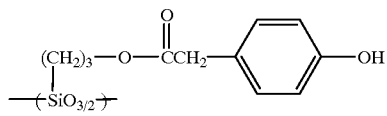 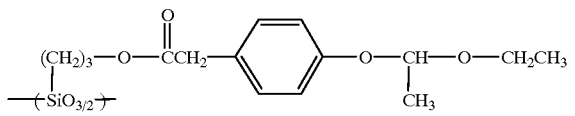 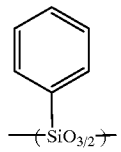
C-57
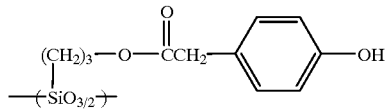 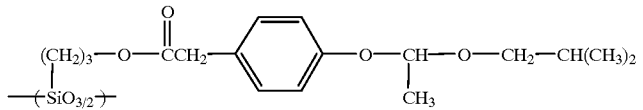 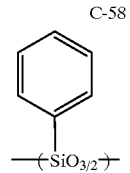
C-58
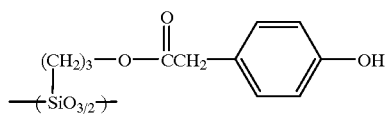 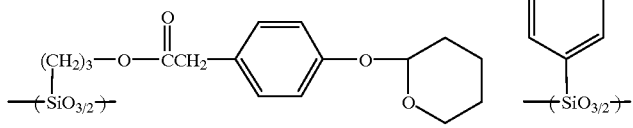 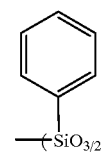
C-59
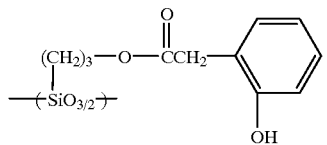 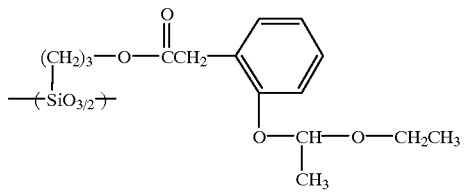 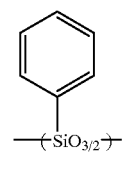
C-60
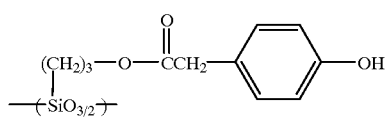 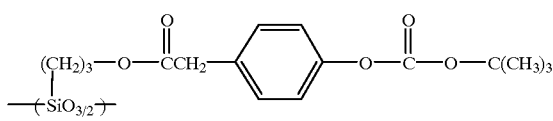 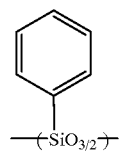
C-61
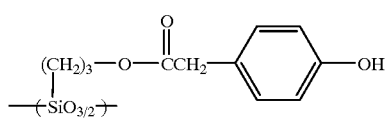 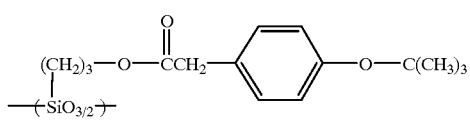 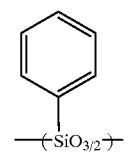
C-62
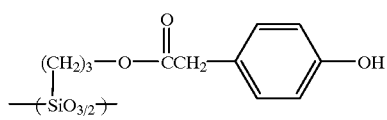 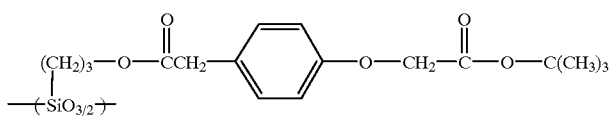 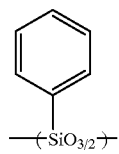
C-63
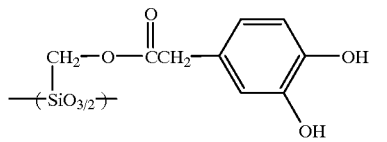 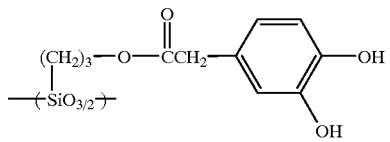
C-64 C-65

-continued
C-66
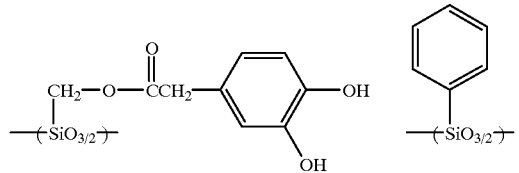 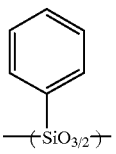
C-67
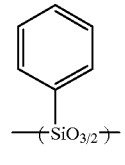
C-68
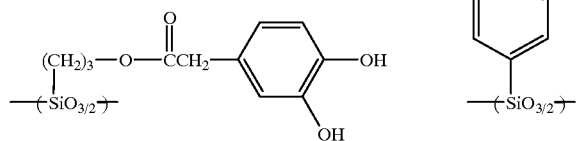 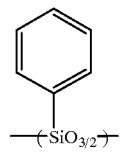
C-69
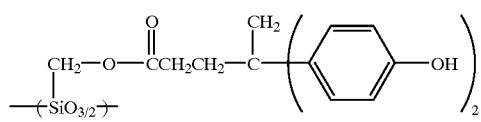
C-70
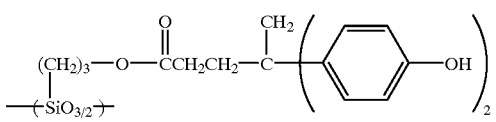
C-71
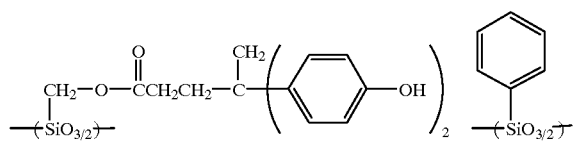
C-72
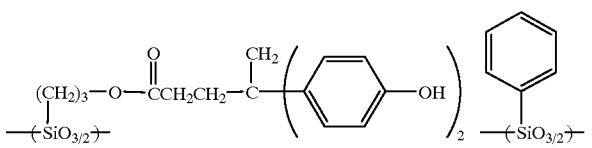
C-73
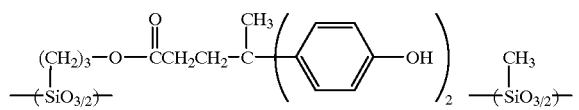
C-74
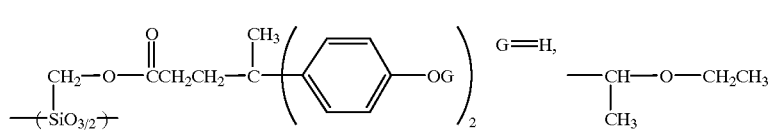 G=H, 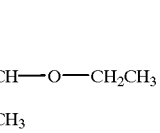
C-75
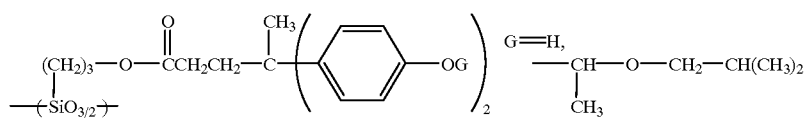 G=H, 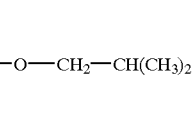
C-76
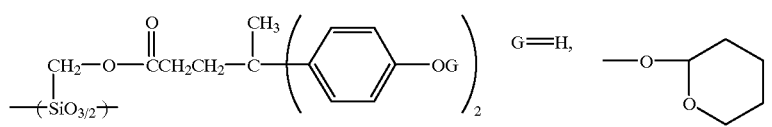 G=H, 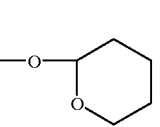
C-77
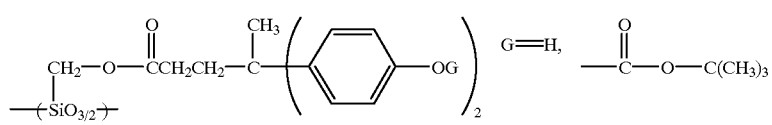 G=H, 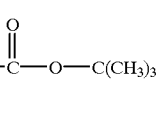
C-78
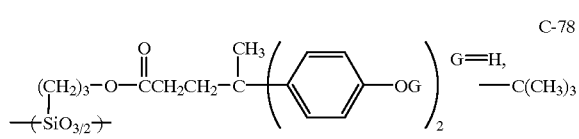 G=H, 

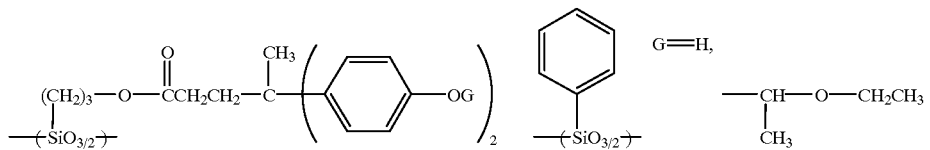
C-79
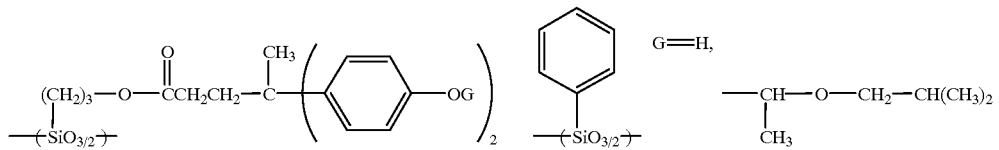
C-80
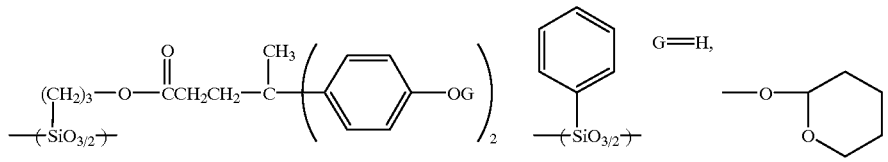
C-81
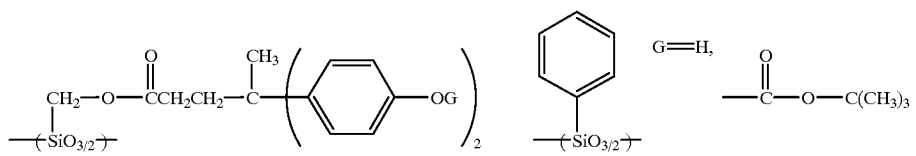
C-82
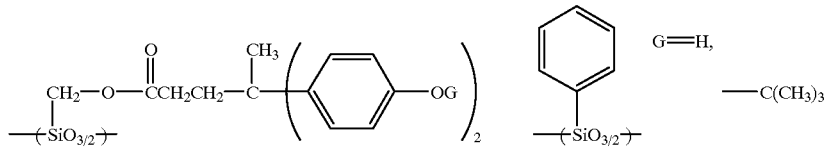
C-83
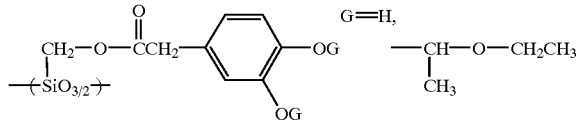
C-84
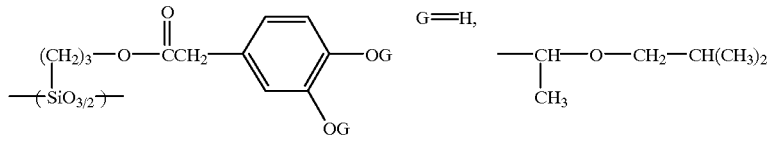
C-84
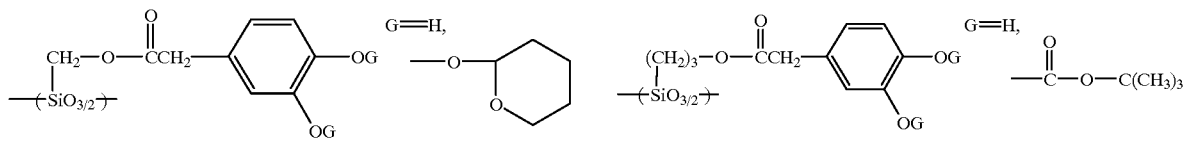
C-85  C-86
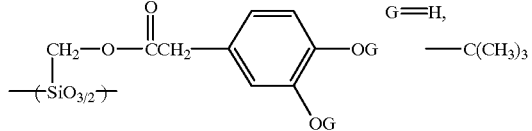
C-88

-continued

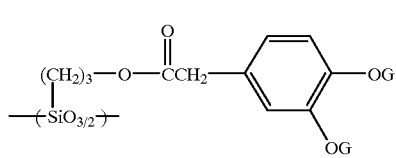 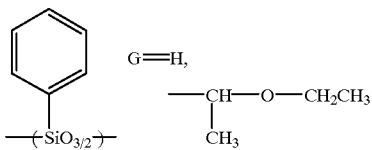

C-89

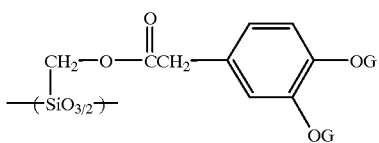 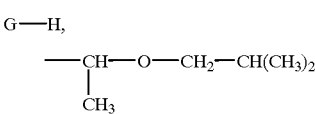

C-90

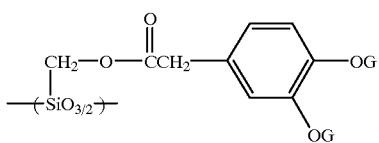 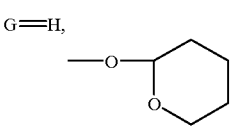

C-91

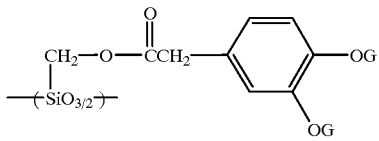 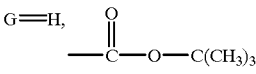

C-92

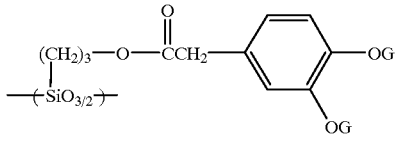 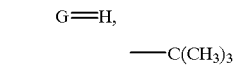

C-93

The weight average molecular weight of the polysiloxane according to the present invention is preferably from 500 to 100,000, more preferably from 700 to 50,000, and particularly preferably from 800 to 20,000, as a polystyrene calculated value in gel permeation chromatography.

The positive photoresist composition according to the present invention will be described below.

The positive photoresist composition according to the present invention contains:

(a) the above-described polysiloxane, and (b) a compound which is decomposed by exposure and generates an acid (a light-acid generating agent).

When the polysiloxane is an alkali-soluble polysiloxane, the positive photoresist composition according to the present invention further contains:

(c) (c1) a phenolic compound having in the molecule a phenolic hydroxyl group at least a part of which is protected by an acid-decomposable group, or (c2) an aromatic or aliphatic carboxylic acid compound having in the molecule a carboxyl group at least a part of which is protected by an acid-decomposable group.

When the polysiloxane is an acid-decomposable polysiloxane, the positive photoresist composition according to the present invention may also contain the above component (c)

Further, when the polysiloxane is an alkali-soluble polysiloxane, the polysiloxane having a structural unit represented by formula (III) is preferably used as the alkali-soluble polysiloxane in view of solvent solubility, sensitivity, resolving power, and the rectangular property of a resist pattern.

Component (b) a light-acid generating agent for use in the present invention is a compound which generates an acid by the irradiation with active rays or radiation.

The compound for use in the present invention which is decomposed by the irradiation with active rays or radiation and generates an acid can be appropriately selected from photocationic polymerization photoinitiators, photoradical polymerization photoinitiators, photo-decoloring agents and photo-discoloring agents of dyes, and compounds which generate an acid by the irradiation with well-known rays used in microresists, etc., (e.g., ultraviolet rays at 200 to 400 nm, far ultraviolet rays, particularly preferably, g-rays, h-rays, i-rays, KrE eximer laser light), ArF eximer laser light, electron beams, X-rays, molecular rays or ion beams, and mixtures of these compounds.

In addition, as other compounds for use in the present invention which generate an acid by the irradiation with active rays or radiation, the following compounds can be exemplified, for example, diazonium salts described in S. I. Schlesinger, *Photogr. Sci. Eng.,* 18, 387 (1974), and T. S. Bal et al., *Polymer*, 21,423(1980); ammonium salts described in U.S. Pat. Nos. 4,069,055, 4,069,056, Re 27,992, and JP-A-3-140140; phosphonium salts described in D. C. Necker et al., *Macromolecules*, 17, 2468 (1984), C. S. Wen et al., *Teh, Proc. Conf. Rad. Curing ASIA*, p. 478, Tokyo, Oct. (1988), U.S. Pat. Nos. 4,069,055and 4,069,056; iodonium salts described in J. V. Crivello et al., *Macromolecules*, 10 (6), 1307 (1977), *Chem. & Eng. News*, Nov. 28, p. 31 (1988), EP Nos. 104143, 339049, 410201, JP-A-2-150848, and JP-A-2-296514; sulfonium salts described in J. V. Crivello et al., *Polymer J.*, 17,73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci.*, Polymer Chem. Ed., 17,2877 (1977), EP Nos. 370693, 161811, 410201, 339049, 233567, 297443, 297442, U.S. Pat. Nos. 3,902,114, 4,933,377, 4,760,013, 4,734,444, 2,833,827, German Patents 2,904,626, 3,604,580, 3,604, 581, JP-A-7-28237 and JP -A-8-27102; selenonium salts described in J. V. Crivello et al., *Macromolecules*, 10 (6), 1307 (1977), and J. V. Crivello et al., *J. Polymer Sci.*, Polymer Chem. Ed., 17, 1047 (1979); onium salts, such as arsonium salts, etc., described in C. S. Wen et al., *Teh, Proc. Conf. Rad. Curing ASIA*, p. 478, Tokyo, Oct. (1988); organic halogen compounds described in U.S. Pat. No. 3,905,815, JP-B -46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; organic metals/organic halogen compounds described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), and JP-A-2-161445; light-acid generating agents having an o-nitrobenzyl protective group described in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130 (6), F. M. Houlihan et al., *Macromolecules*, 21, 2001 (1988), EP Nos. 0290750, 046083, 156535, 271851, 0388343, U.S. Pat. Nos. 3,901,710, 4,181,531, JP-A-60-198538, and JP-A-53-133022; compounds which generate a sulfonic acid by photodecomposition represented by iminosulfonate described in M. Tunooka et al., *Polymer Preprints. Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), EP Nos. 0199672, 84515, 044115, 618564, 0101122, U.S. Pat. Nos. 4,371,605, 4,431,774, JP-A-64-18143, JP-A-2-245756, and JP-A-3-140109; disulfone compounds described in JP-A-61-166544 and JP-A-2-71270; and diazoketosulfone and diazodisulfone compounds described in JP-A-3-103854, JP-A-3-103856 and JP-A-4-210960.

Further, compounds having introduced these groups or compounds generating an acid by irradiation of light into the polymer main chain or side chain can be used in the present invention, e.g., compounds described in M. E. Woodhouse et al., *J. Am. Chem, Soc.*, 104, 5586 (1982), S. P. Pappas et al., *J. Imaging Sci.*, 30 (5), 218 (1986), S. Kondo et al., *Makromol. Chem.*, Rapid Commun., 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP -A-63-146038, JP-A-63-163452, JP-A-62-153853, and JP-A-63-146029.

Further, the compounds which generate an acid by light as described, e.g., in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and EP No. 126712 can also be used in the present invention.

Of the above compounds which are decomposed by the irradiation with active rays or radiation and generate an acid, those particularly effectively used in the present invention are described below.

(1) An oxazole derivative represented by the following formula (PAG1) substituted with a trihalomethyl group or an S-triazine derivative represented by formula (PAG2)

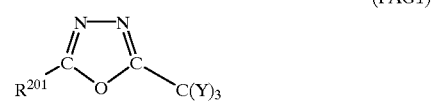

(PAG1)

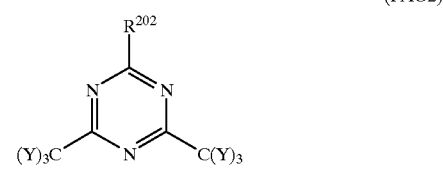

(PAG2)

wherein $R^{201}$ represents a substituted or unsubstituted aryl group or alkenyl group; $R^{202}$ represents a substituted or unsubstituted aryl group, alkenyl group or alkyl group, or —C(Y)$_3$; and Y represents a chlorine atom or a bromine atom.

Specific examples are shown below but the present invention is not limited thereto.

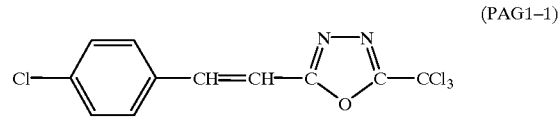

(PAG1-1)

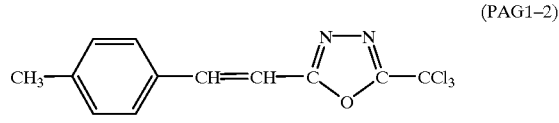

(PAG1-2)

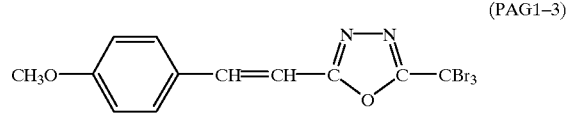

(PAG1-3)

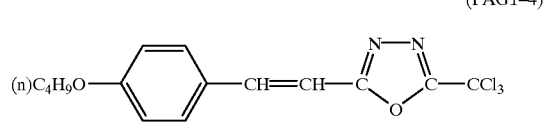

(PAG1-4)

(PAG1-5)
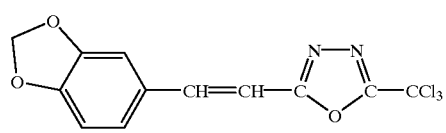
(PAG1-6)
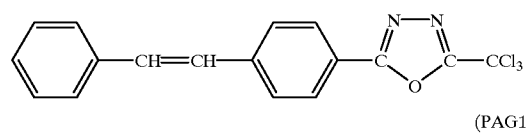
(PAG1-7)
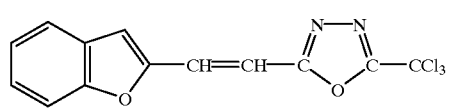
(PAG1-8)
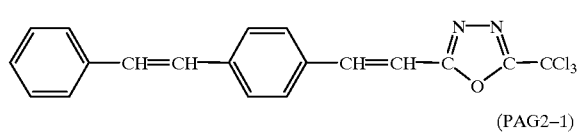
(PAG2-1)
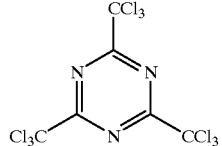
(PAG2-2)
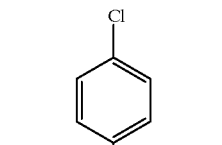
(PAG2-3)
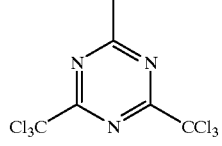
(PAG2-4)
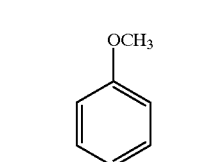
(PAG2-5)
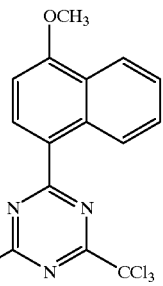
(PAG2-6)
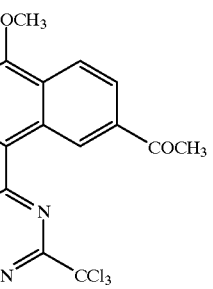
(PAG2-7)
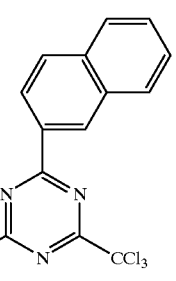
(PAG2-8)
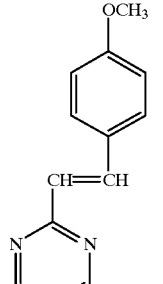
(PAG2-9)
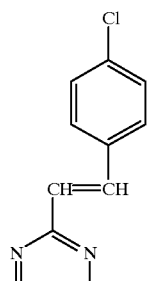

(PAG2-10)

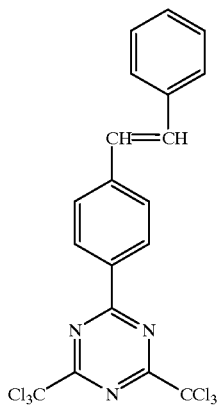

(2) An iodonium salt represented by the following formula (PAG3) or a sulfonium salt represented by formula (PAG4)

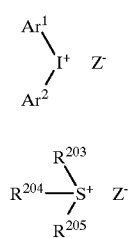
(PAG3)

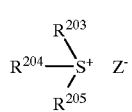
(PAG4)

wherein $Ar^1$ and $Ar^2$ each represents a substituted or unsubstituted aryl group. Examples of preferred substituents include an alkyl group, a haloalkyl group, a cycloalkyl group, an aryl group, an alkoxyl group, a nitro group, a carboxyl group, an alkoxycarbonyl group, a hydroxyl group, a mercapto group, and a halogen atom.

$R^{203}$, $R^{204}$, $R^{205}$ each represents a substituted or unsubstituted alkyl group or aryl group, preferably an aryl group having from 6 to 14 carbon atoms, an alkyl group having from 1 to 8 carbon atoms, or substituted derivatives thereof. Examples of preferred substituents for the aryl group include an alkoxyl group having from 1 to 8 carbon atoms, an alkyl group having from 1 to 8 carbon atoms, a nitro group, a carboxyl group, a hydroxyl group and a halogen atom, and examples of preferred substituents for the alkyl group include an alkoxyl group having from 1 to 8 carbon atoms, a carboxyl group, and an alkoxycarbonyl group.

$Z^-$ represents a counter anion, e.g., a perfluoroalkanesulfonate anion such as $BF_4^-$, $AsF_6^-$, $PF_6^-$, $SbF_6^-$, $SiF_6^{2-}$, $ClO_4^-$, and $CF_3SO_3^-$, a pentafluorobenzenesulfonate anion, a condensed polynuclear aromatic sulfonate anion such as a naphthalene-1-sulfonate anion, an anthraquinonesulfonate anion, or a sulfonic acid group-containing dye, but the present invention is not limited thereto.

Further, two of $R^{203}$, $R^{204}$ and $R^{205}$, and $Ar^1$ and $Ar^2$ may be bonded through respective single bonds or substituents.

Specific examples thereof are shown below but the present invention is not limited thereto.

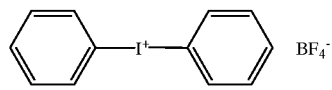
(PAG3-1)

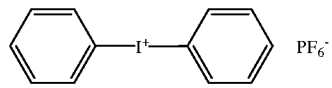
(PAG3-2)

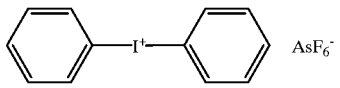
(PAG3-3)

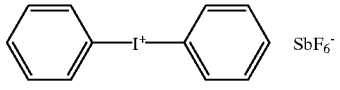
(PAG3-4)

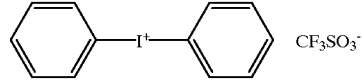
(PAG3-5)

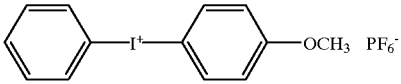
(PAG3-6)

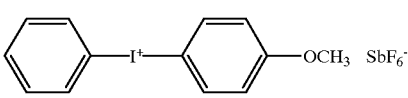
(PAG3-7)

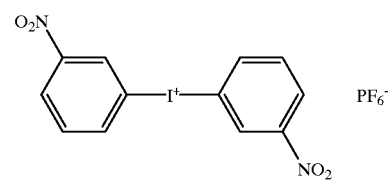
(PAG3-8)

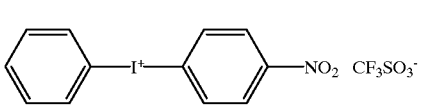
(PAG3-9)

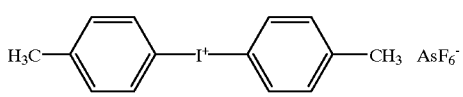
(PAG3-10)

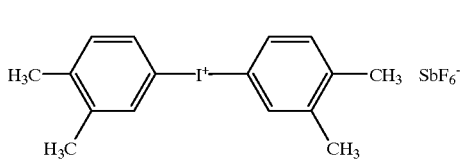
(PAG3-11)

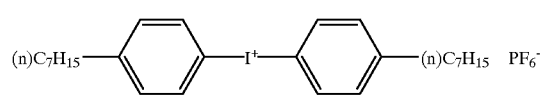
(PAG3-12)

(PAG3-13)
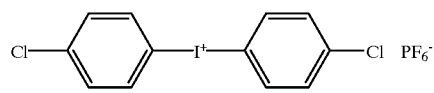
(PAG3-14)
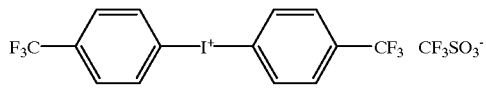
(PAG3-15)
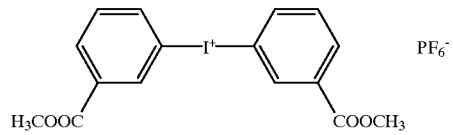
(PAG3-16)
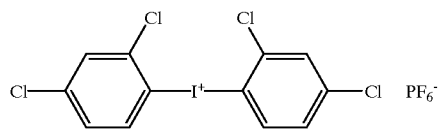
(PAG3-17)
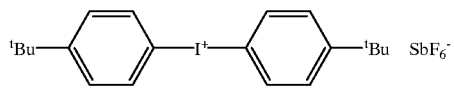
(PAG3-18)
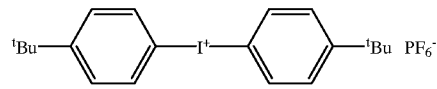
(PAG3-19)
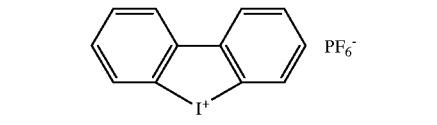
(PAG3-20)
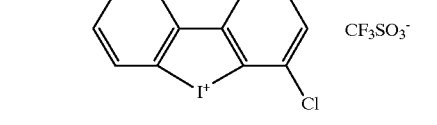
(PAG3-21)
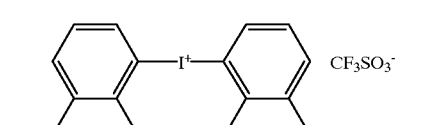
(PAG3-22)
(PAG3-23)
(PAG3-24)
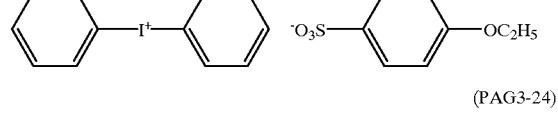
(PAG3-25)
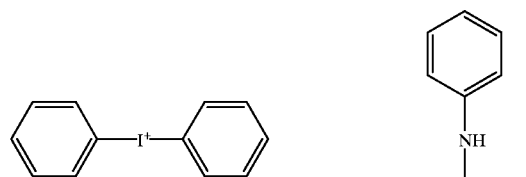
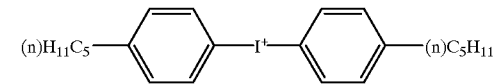
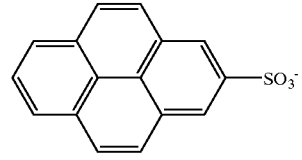
(PAG3-26)
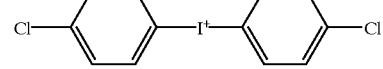
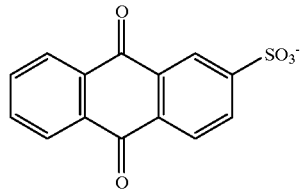
(PAG3-27)
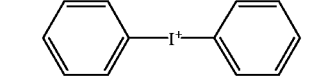
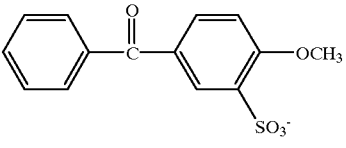
(PAG3-28)
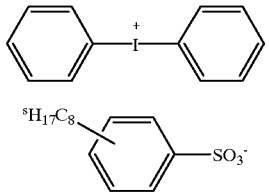

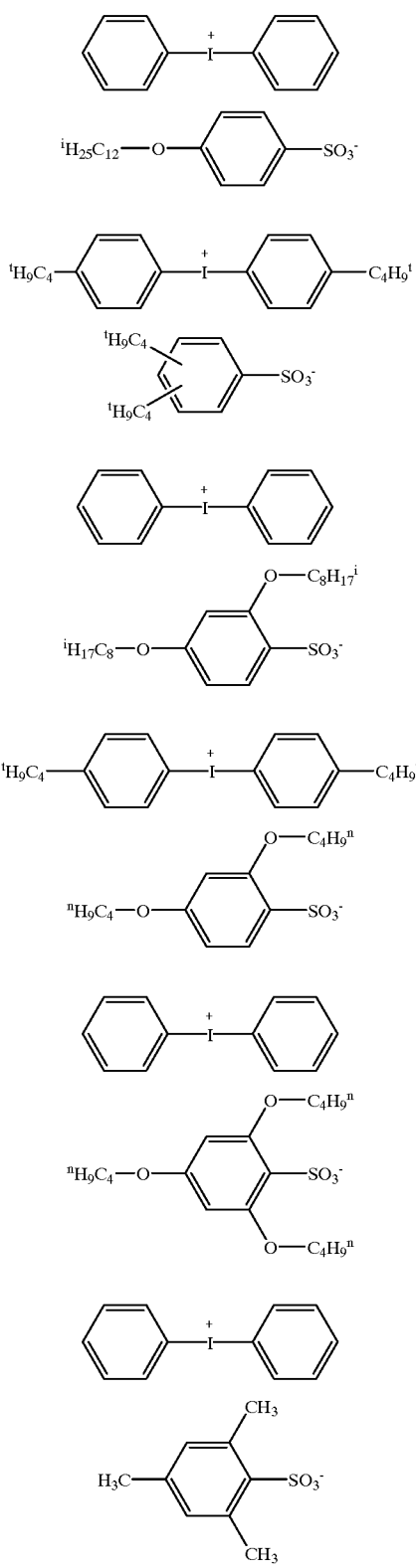
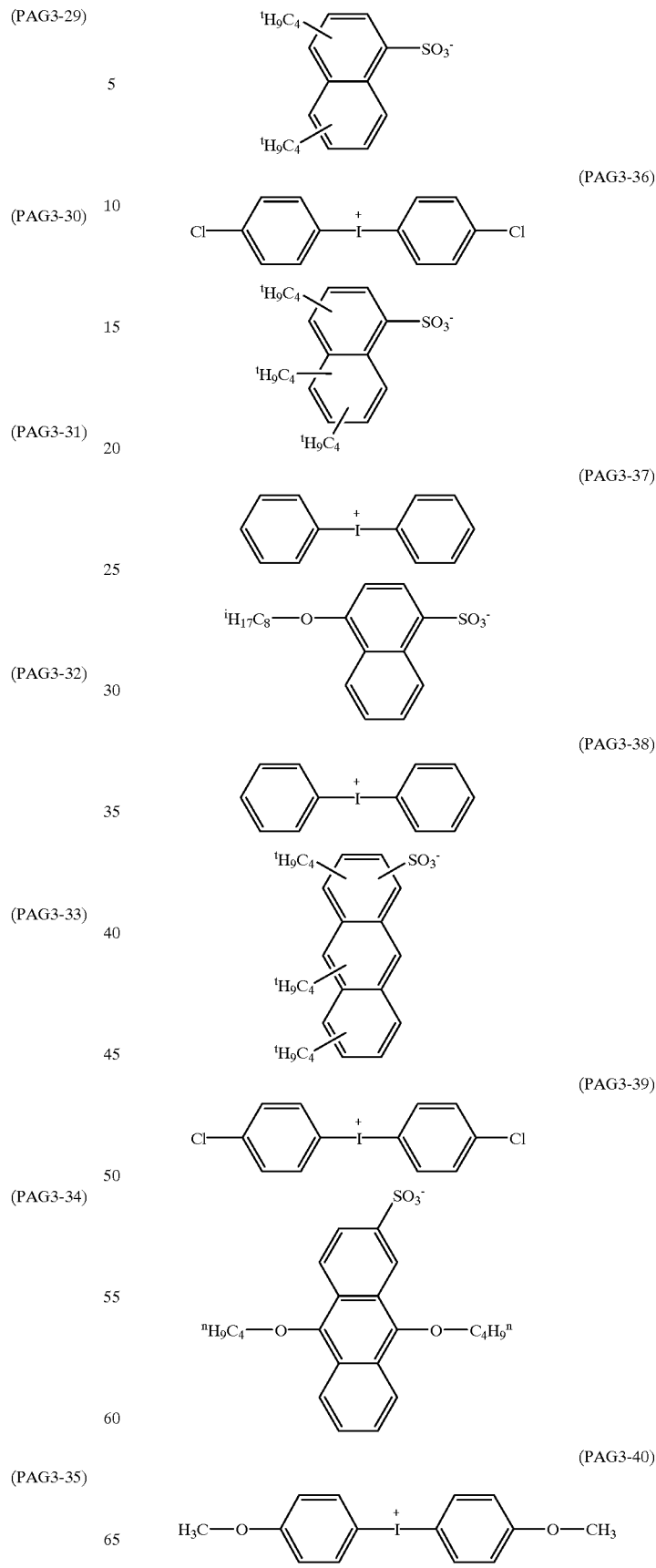

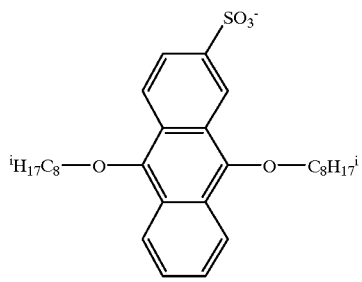
(PAG4-1)
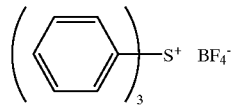
(PAG4-2)
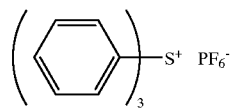
(PAG4-3)
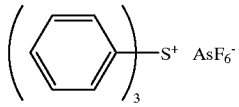
(PAG4-4)
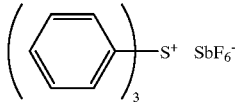
(PAG4-5)
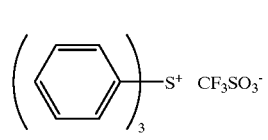
(PAG4-6)
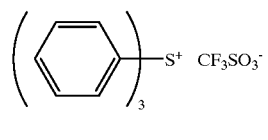
(PAG4-7)
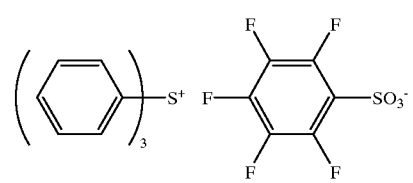
(PAG4-8)
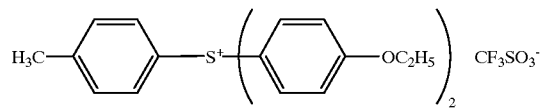
(PAG4-9)
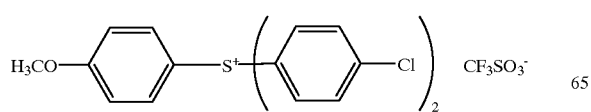
(PAG4-10)
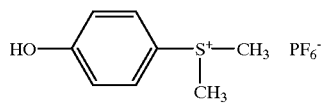
(PAG4-11)
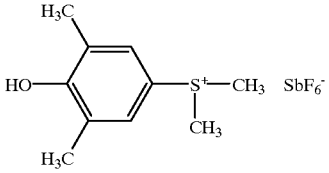
(PAG4-12)
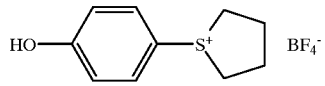
(PAG4-13)
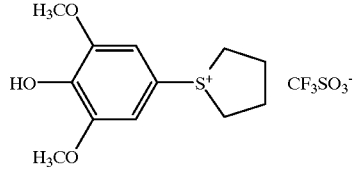
(PAG4-14)
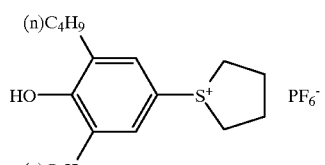
(PAG4-15)
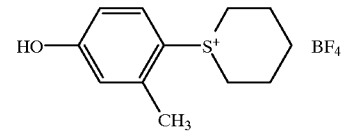
(PAG4-16)
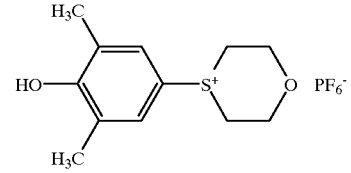
(PAG4-17)
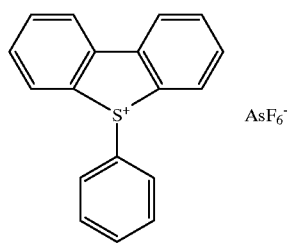

-continued
(PAG4-18)
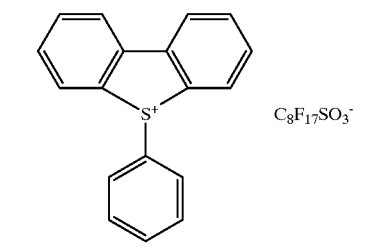
(PAG4-19)
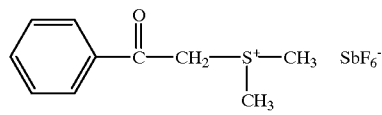
(PAG4-20)
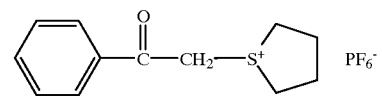
(PAG4-21)
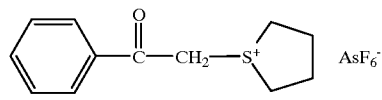
(PAG4-22)
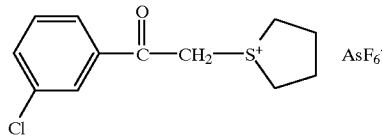
(PAG4-23)
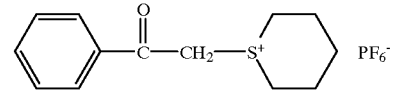
(PAG4-24)
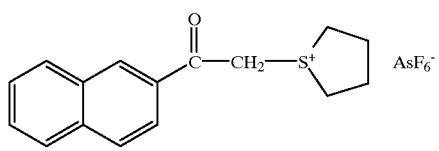
(PAG4-25)
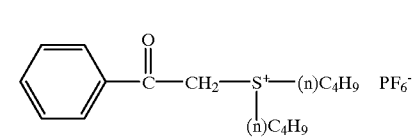
(PAG4-26)
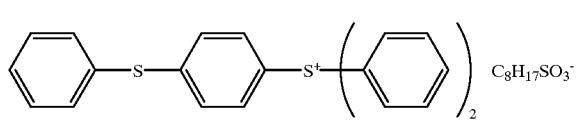
(PAG4-27)
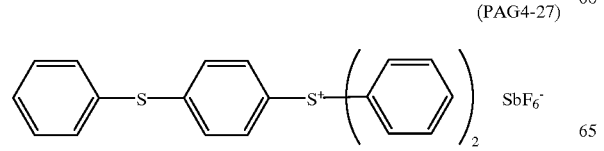
(PAG4-28)
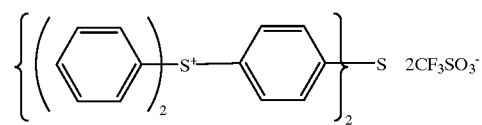
(PAG4-29)
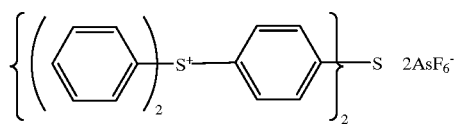
(PAG4-30)
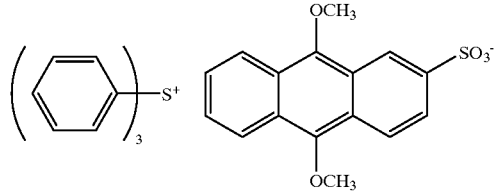
(PAG4-31)
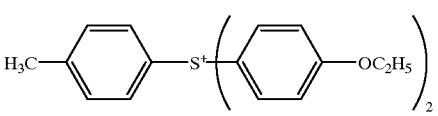
(PAG4-32)
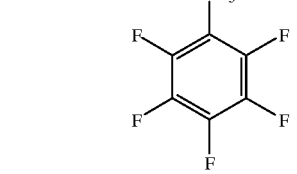
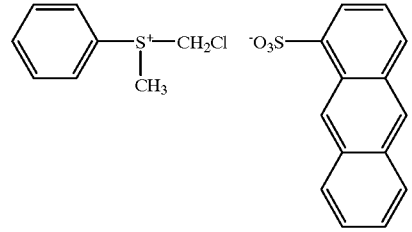
(PAG4-33)
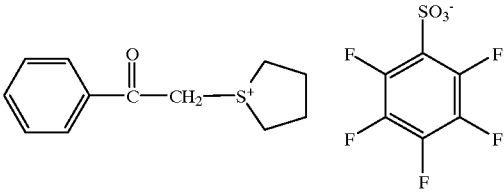
(PAG4-34)
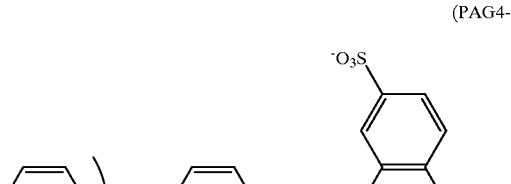

-continued
(PAG4-35)
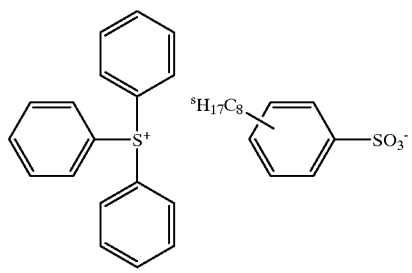
(PAG4-36)
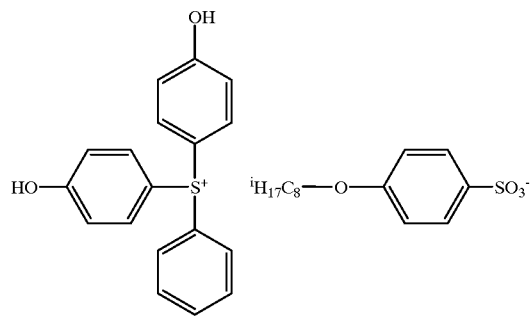
(PAG4-37)
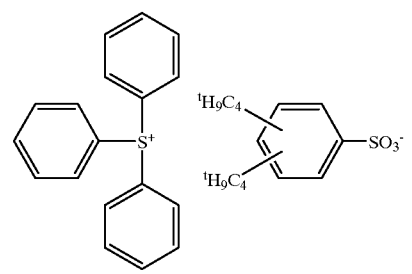
(PAG4-38)
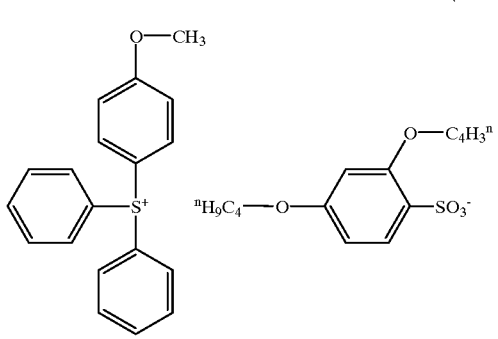
(PAG4-39)
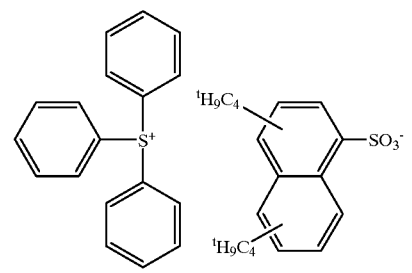
-continued
(PAG4-40)
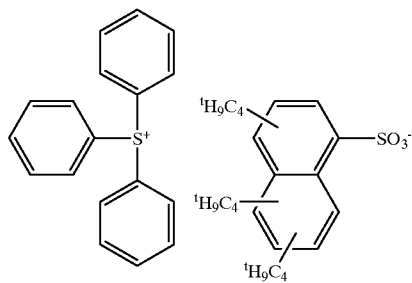
(PAG4-41)
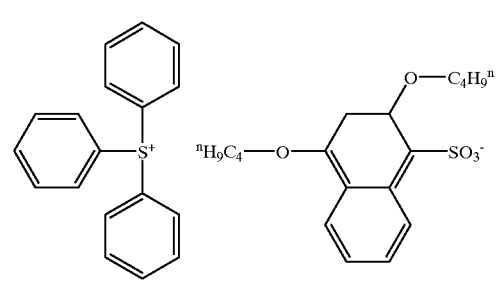
(PAG4-42)
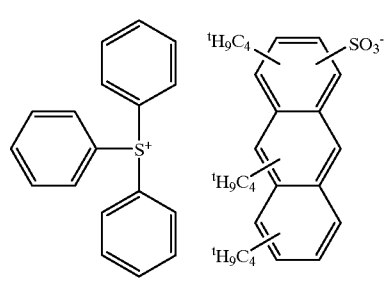
(PAG4-43)
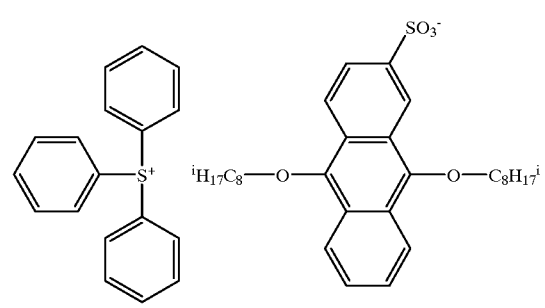
(PAG4-44)
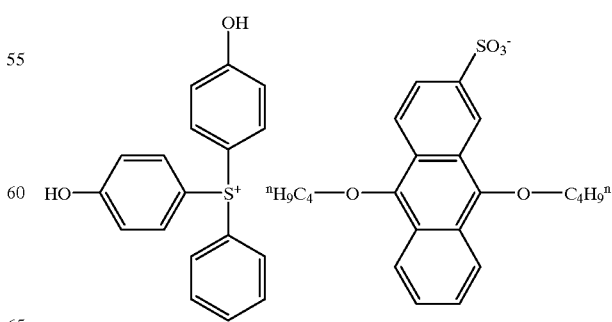

-continued (PAG4-45)

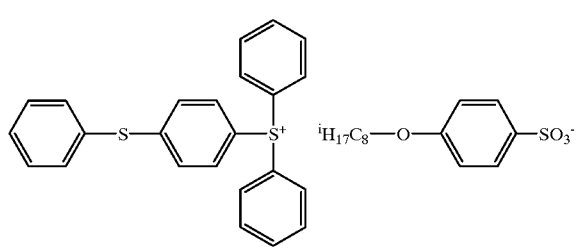

(PAG5-1)

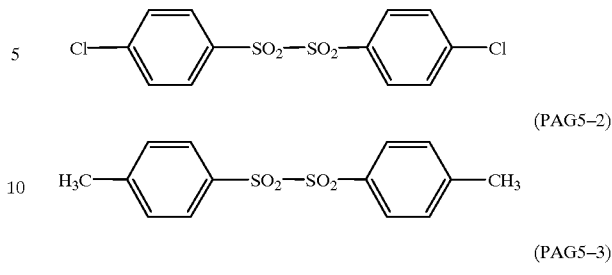

(PAG5-2)

(PAG4-46)

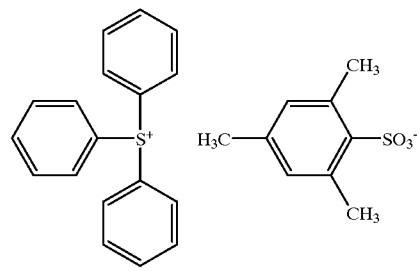

(PAG5-3)

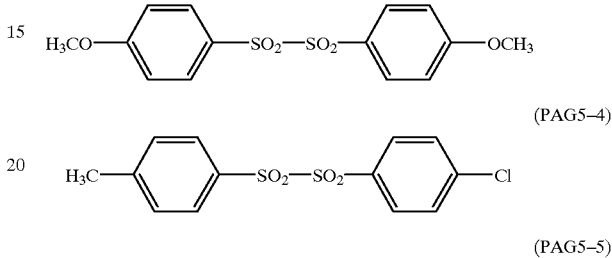

(PAG5-4)

(PAG4-47)

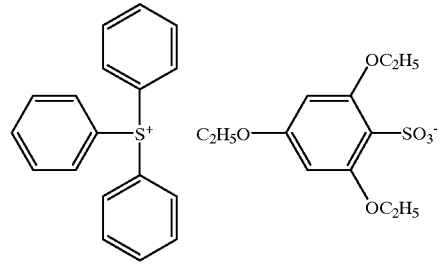

(PAG5-5)

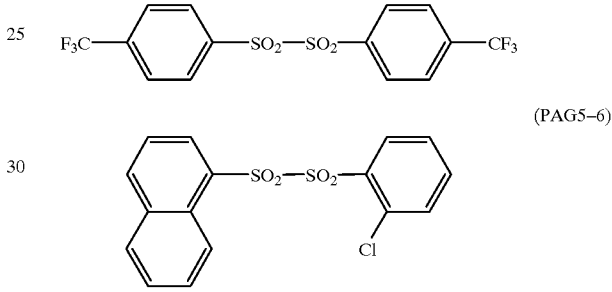

(PAG5-6)

(PAG5-7)

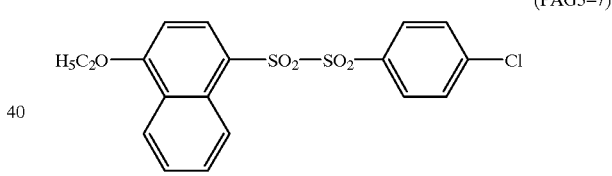

(PAG5-8)

The above-described onium salts represented by formula (PAG3) or (PAG4) are well-known compounds and can be synthesized according to the methods described, e.g., in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polymer Sci.*, Polymer Chem. Ed., 18, 2677 (1980), U.S. Pat. Nos. 2,807,648, 4,247,473, and JP-A-53-101331.

(3) A disulfone derivative represented by the following formula (PAG5) or an iminosulfonate derivative represented by formula (PAG6)

(PAG5)

$$Ar^3-SO_2-SO_2-Ar^4$$

(PAG6)

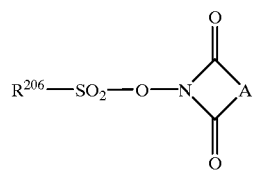

wherein $Ar^3$ and $Ar^4$ each represents a substituted or unsubstituted aryl group; $R^{206}$ represents a substituted or unsubstituted alkyl group or aryl group; and A represents a substituted or unsubstituted alkylene group, alkenylene group, or arylene group.

Specific examples thereof are shown below but the present invention is not limited thereto.

(PAG5-9)

(PAG5-10)

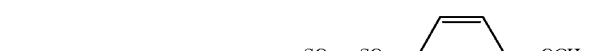
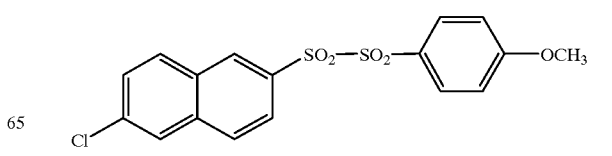

(PAG5-11) 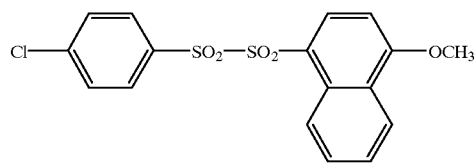
(PAG5-12) 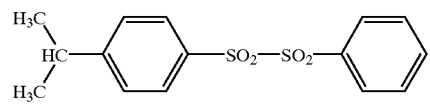
(PAG5-13) 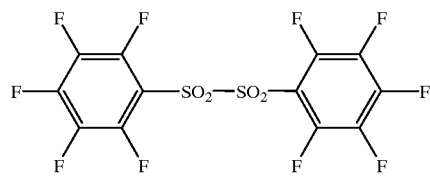
(PAG5-14) 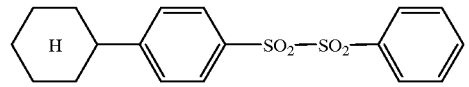
(PAG6-1) 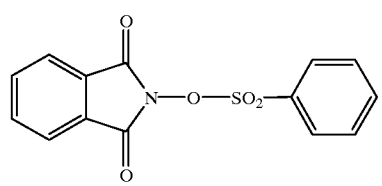
(PAG6-2) 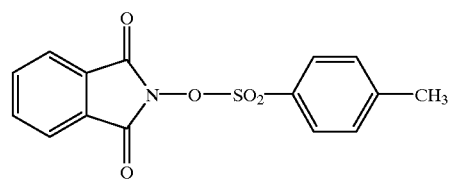
(PAG6-3) 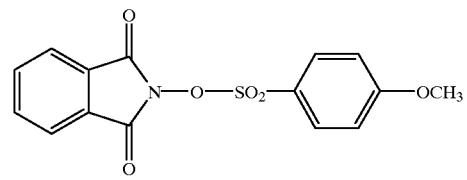
(PAG6-4) 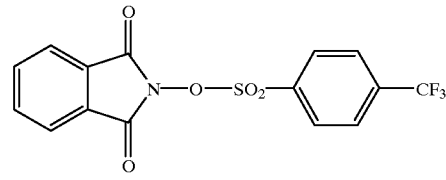
(PAG6-5) 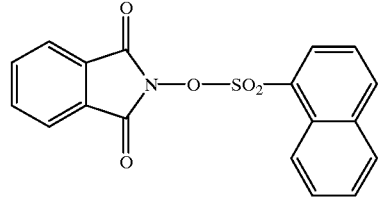
(PAG6-6) 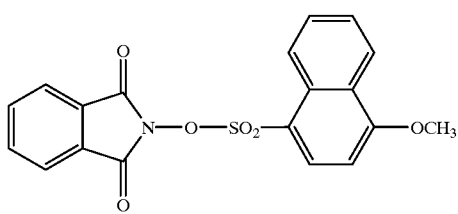
(PAG6-7) 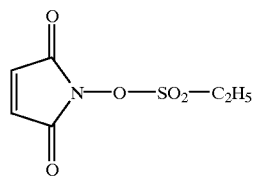
(PAG6-8) 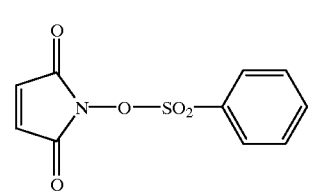
(PAG6-9) 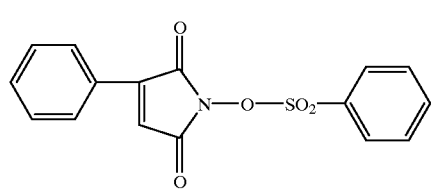
(PAG6-10) 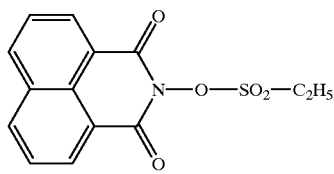
(PAG6-11) 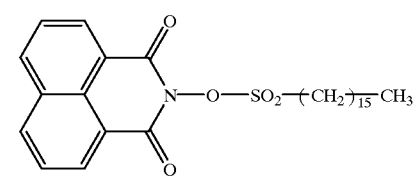
(PAG6-12) 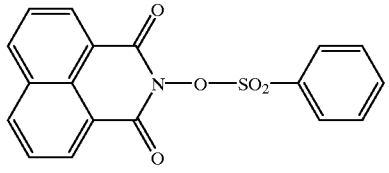
(PAG6-13) 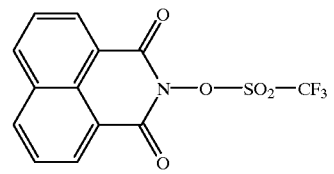

(PAG6-14)

(PAG6-15)

In the present invention, component (b) a light-acid generating agent is preferably an onium salt, a disulfone, a 4-DNQ (diazonaphthoquinone)sulfonate, or a triazine compound.

The addition amount of (b) a light-acid generating agent is generally from 0.001 to 40% by weight, preferably from 0.01 to 20% by weight, and more preferably from 0.1 to 5% by weight, based on the total weight of the positive photoresist composition according to the present invention (excluding the solvent in the coating solution). If the amount of the compound which is decomposed by the irradiation with active rays or radiation and generates an acid is less than 0.001% by weight, sensitivity lowers, and if the amount is more than 40% by weight, light absorption of the resist becomes higher, as a result, profiling is deteriorated and process margin (in particular, baking) disadvantageously narrows.

As the component (c) (c1) a phenolic compound having in the molecule a phenolic hydroxyl group at least a part of which is protected by an acid-decomposable group, or (c2) an aromatic or aliphatic carboxylic acid compound having in the molecule a carboxyl group at least a part of which is protected by an acid-decomposable group, for example, an aromatic compound having from 2 to 7 aromatic rings and a molecular weight of from 186 to 1,500, and a phenolic compound selected from hydroxy-styrene copolymers having a weight average molecular weight of from 2,000 to 20,000 measured by a GPC (gel permeation chromatography) method in which from 20 to 100% of the hydroxyl groups is protected by acid-decomposable groups can be exemplified.

The acid-decomposable group as used herein is the same as the acid-decomposable group which protects the phenolic hydroxyl group of the alkali-soluble polysiloxane containing a structural unit represented by formula (I) to make the alkali-soluble polysiloxane an acid-decomposable polysiloxane, and details are described above.

The addition amount of component (c) is preferably as follows.

(i) When the positive photoresist composition according to the present invention contains (a) an acid-decomposable polysiloxane as the polysiloxane, the addition amount of component (c) is preferably from 1 to 40% by weight, more preferably from 2 to 30% by weight, and particularly preferably from 5 to 20% by weight, based on the weight of the polysiloxane.

(ii) When the positive photoresist composition according to the present invention contains (a) an alkali-soluble polysiloxane as the polysiloxane, the addition amount of component (c) is preferably from 5 to 50% by weight, more preferably from 10 to 40% by weight, and particularly preferably from 20 to 30% by weight, based on the weight of the polysiloxane.

(iii) When the positive photoresist composition according to the present invention contains (a) an alkali-soluble polysiloxane and an acid-decomposable polysiloxane as the polysiloxane, the addition amount of component (c) is preferably from 1 to 30% by weight, more preferably from 2 to 25% by weight, and particularly preferably from 5 to 15% by weight, based on the weight of the polysiloxane.

Specific examples of component (c) are shown below.

(1)

(2)

(3)

(4)

(5)

(6)

(7)

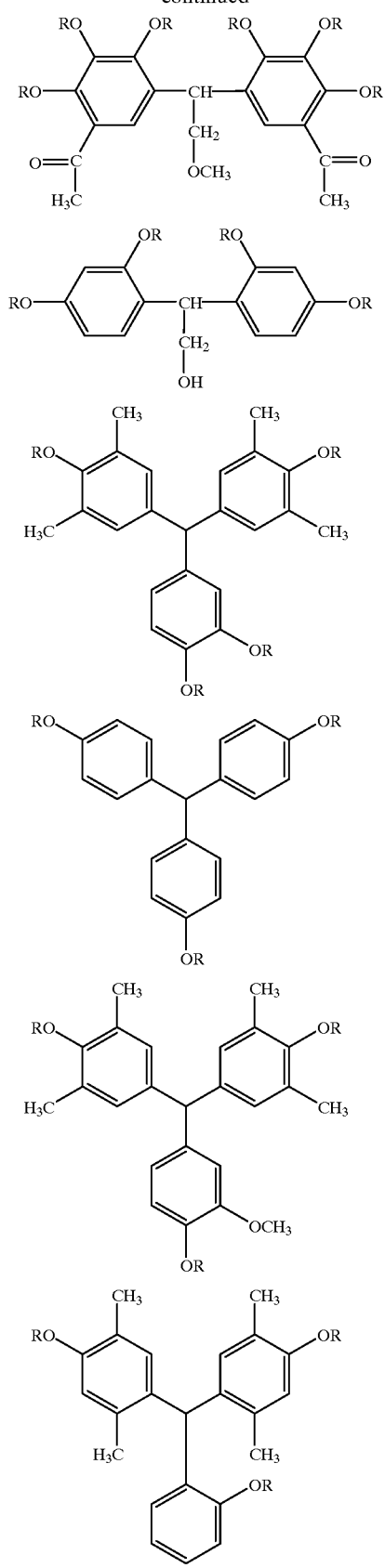
(8)
(9)
(10)
(11)
(12)
(13)
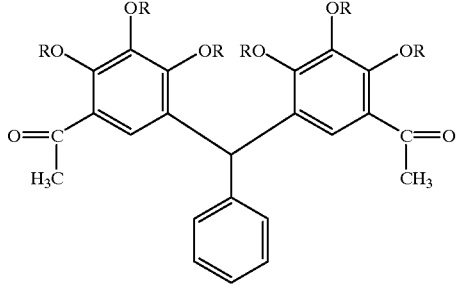
(14)
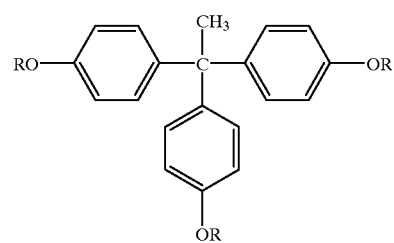
(15)
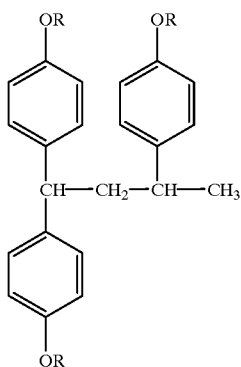
(16)
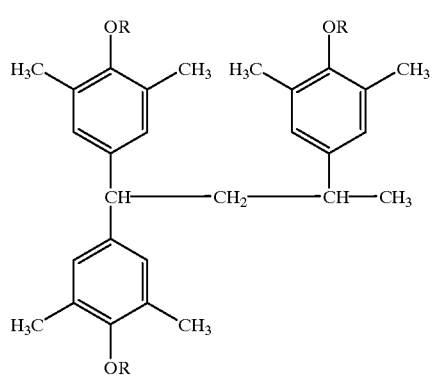
(17)

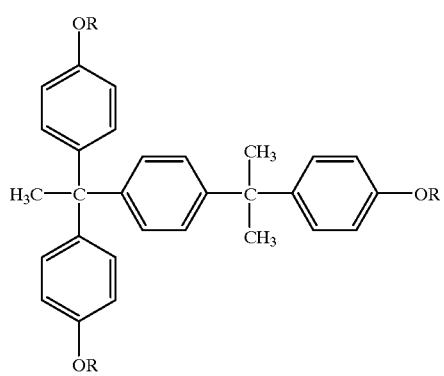
(18)
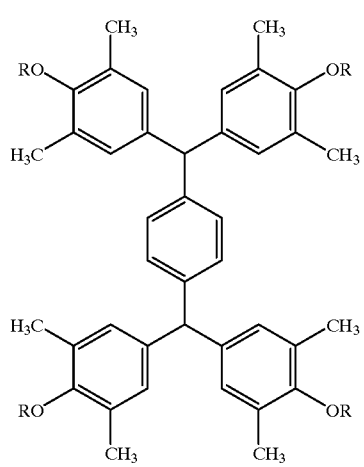
(19)
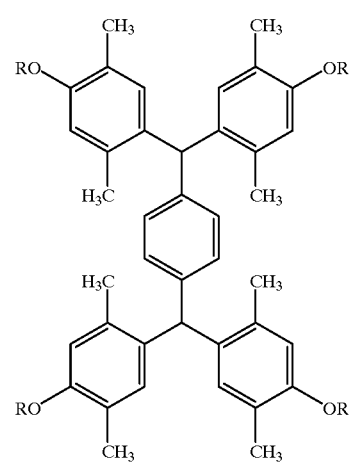
(20)
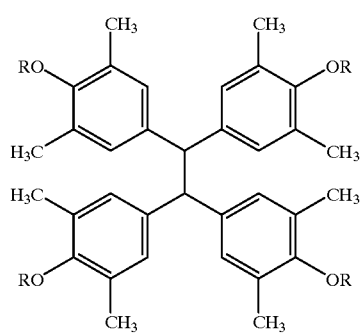
(21)
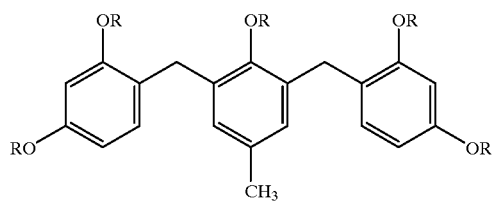
(22)
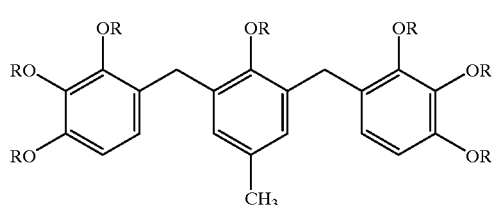
(23)
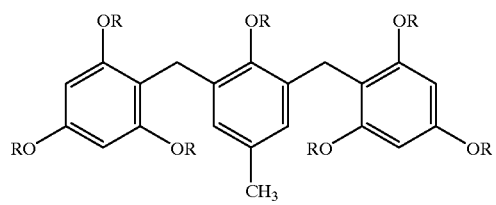
(24)
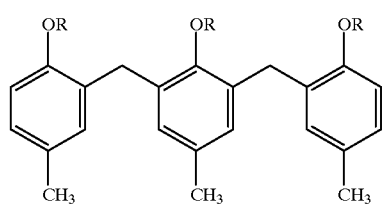
(25)
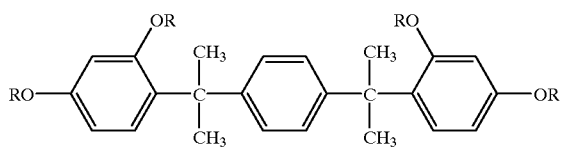
(26)
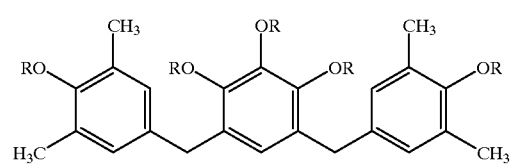
(27)
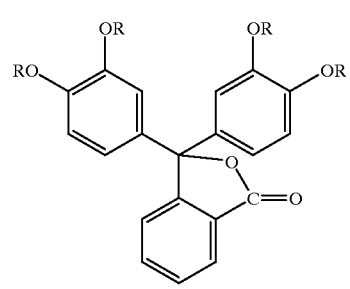
(28)

(29)
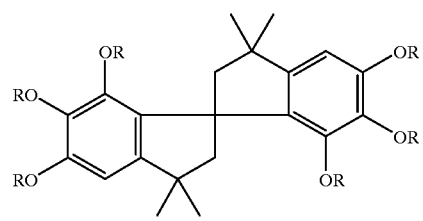
(30)
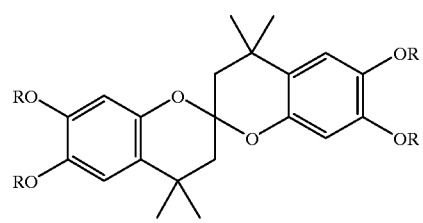
(31)
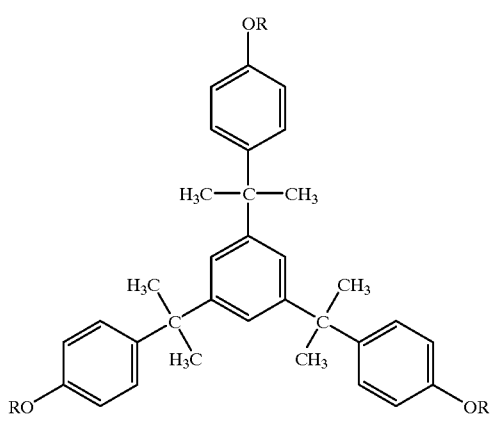
(32)
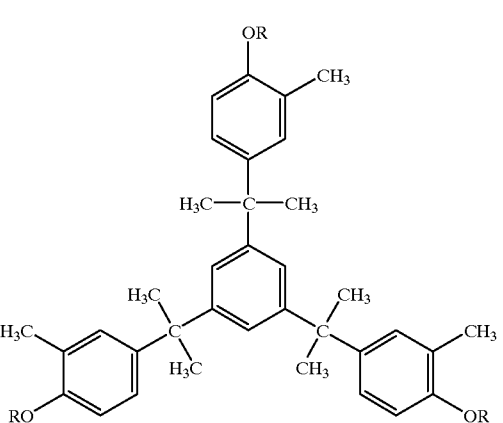
(33)
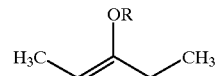
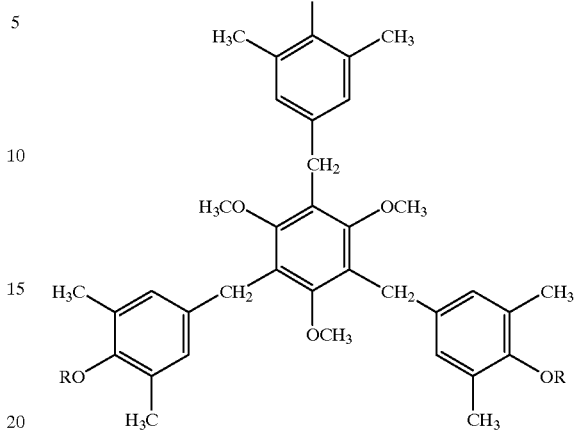
(34)
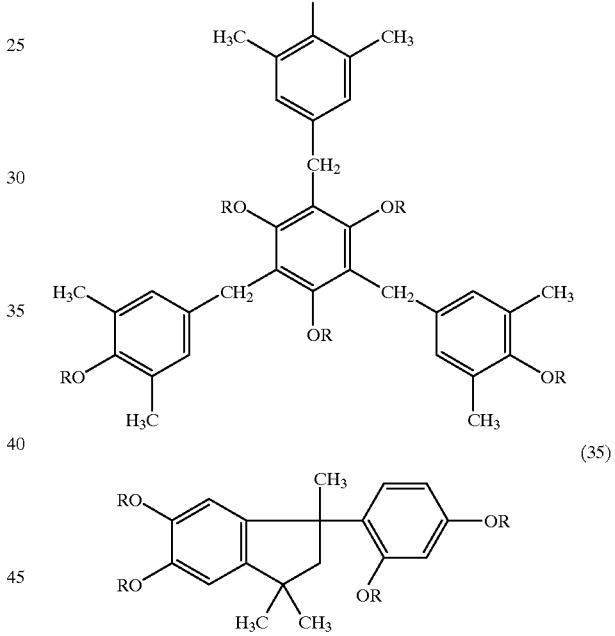
(35)
(36)
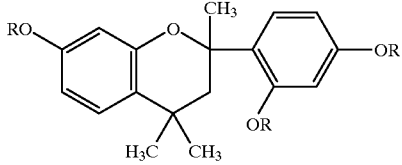
(37)
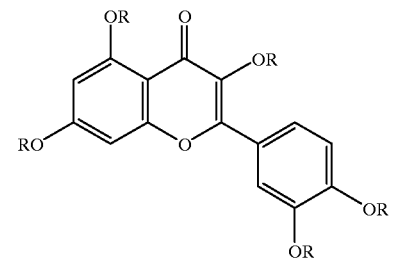

(38)
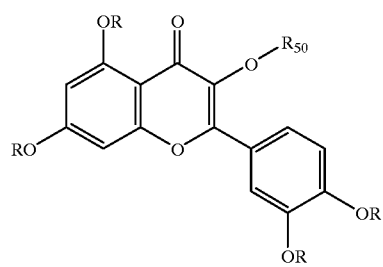
(39)
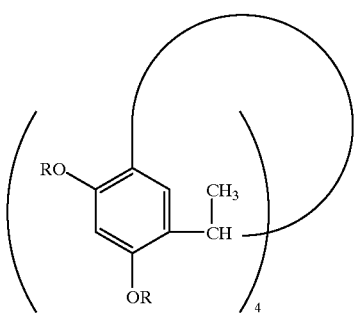
(40)
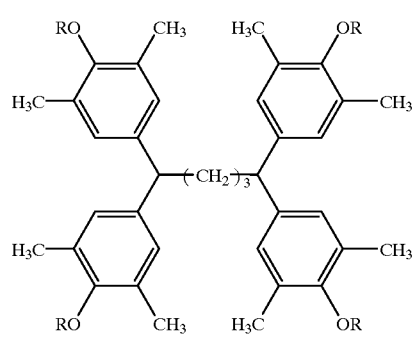
(41)
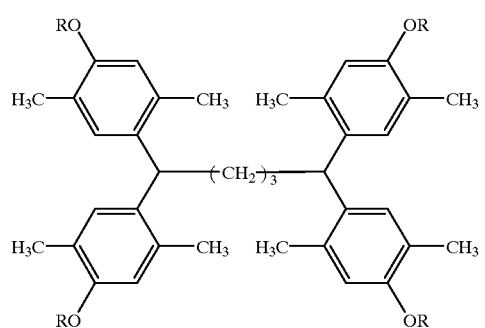
(42)
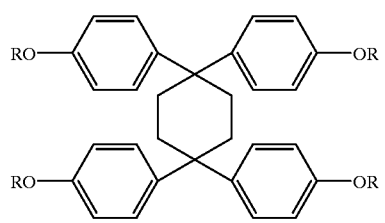
(43)
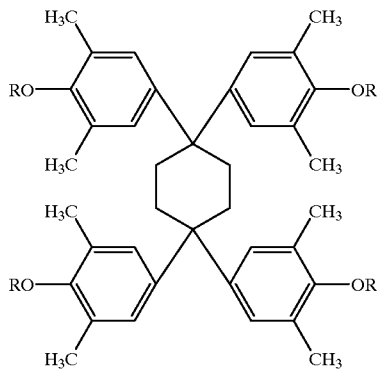
(44)
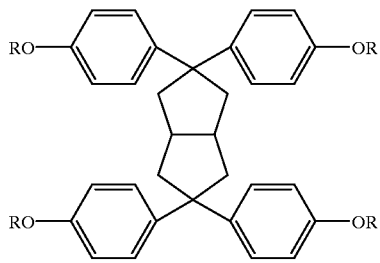
(45)
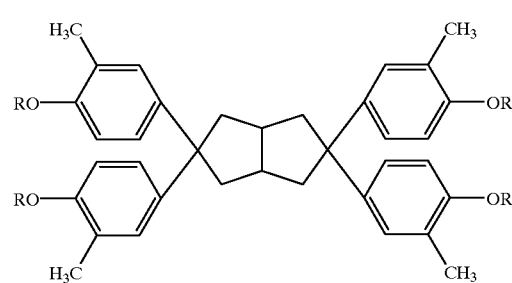
(46)
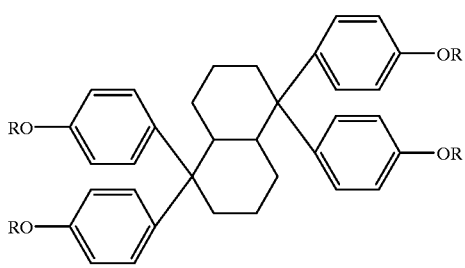
(47)
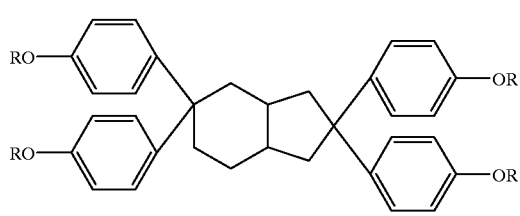

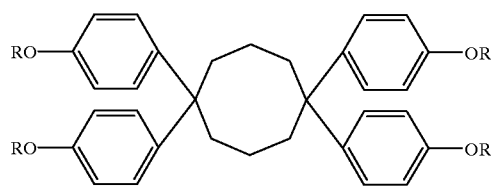
(48)
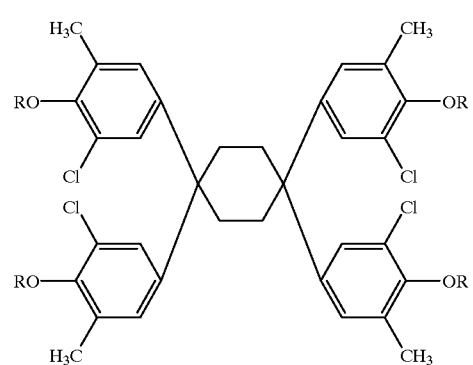
(49)
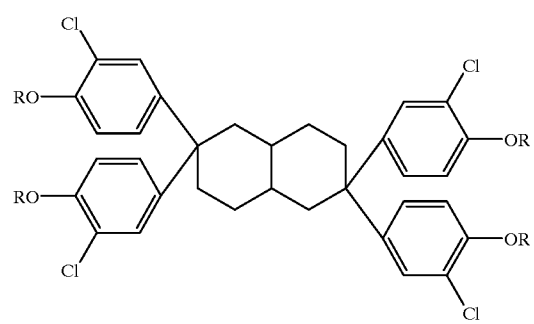
(50)
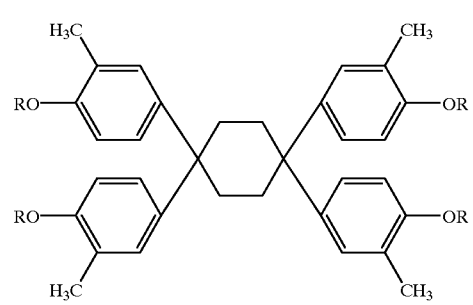
(51)
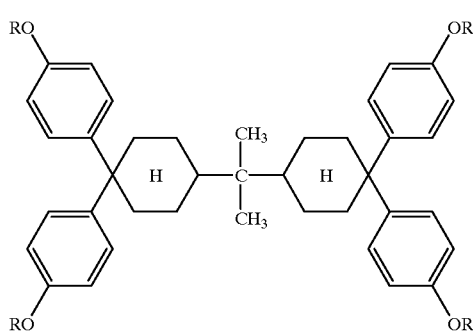
(52)
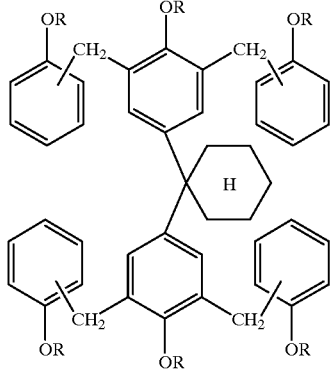
(53)
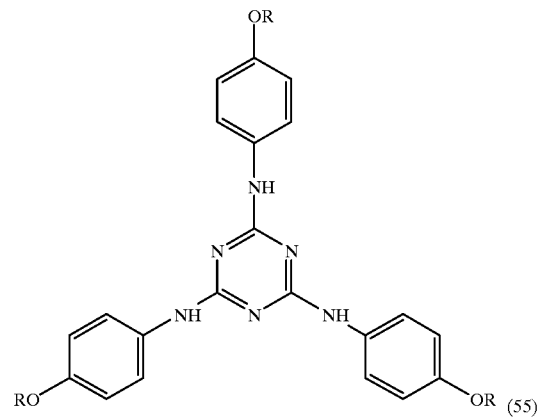
(54)
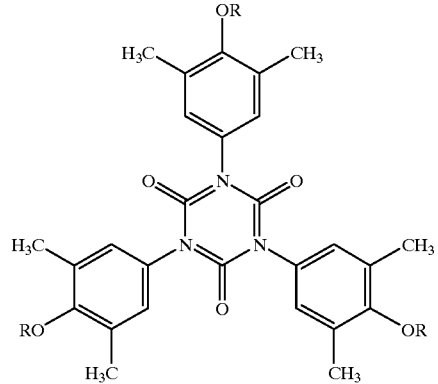
(55)
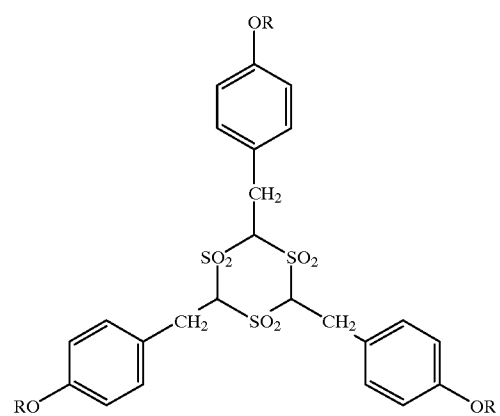
(56)

-continued
(57)
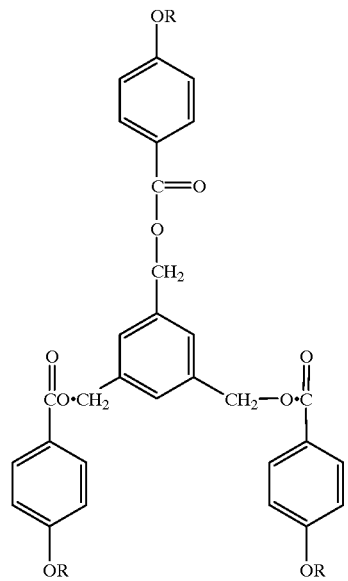
(58)
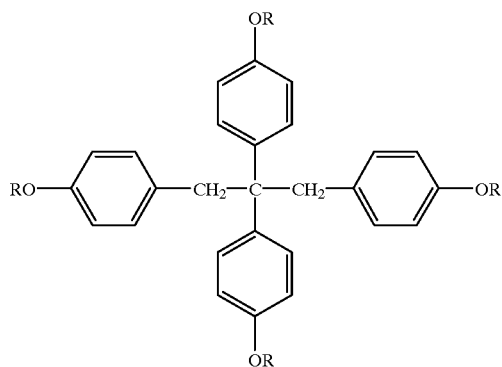
(59)
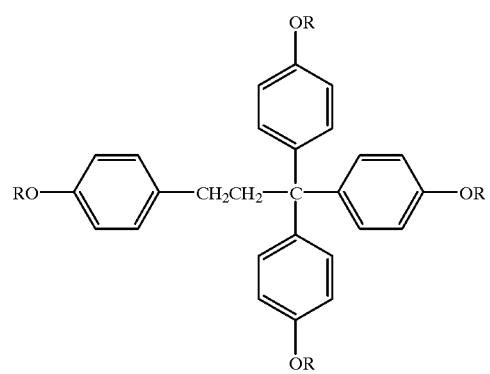
(60)
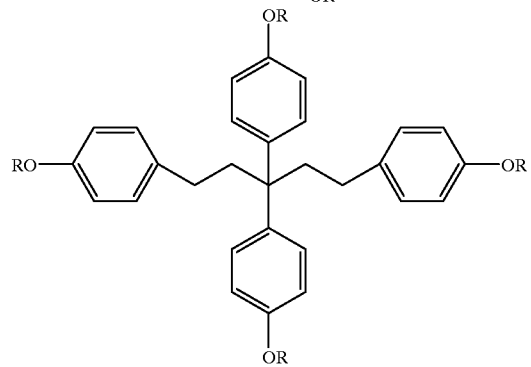
-continued
(61)
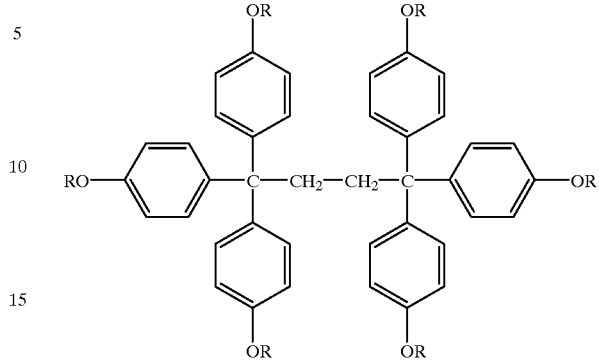
(62)
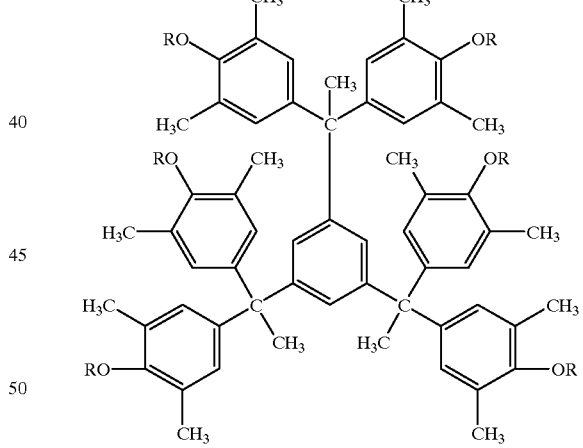
(63)
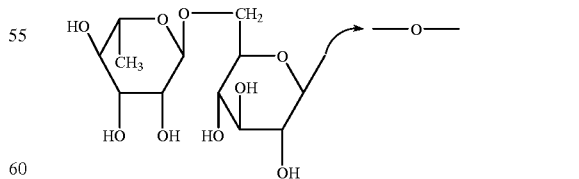
$R_{50}$: is bonded to —O—.
In formulae (1) to (63), R represents a hydrogen atom or a group selected from among —CH$_2$—COO—C(CH$_3$)$_2$C$_6$H$_5$, —CH$_2$—COO—C$_4$H$_9{}^t$, —COO—C$_4$H$_9{}^t$,

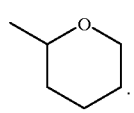
Provided that at least two, or three according to the structure, are groups other than a hydrogen atom, and that each substituent R may not be the same group.
(64)
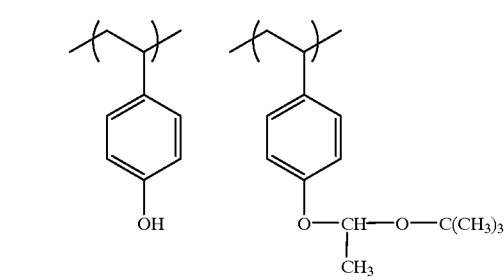
(65)
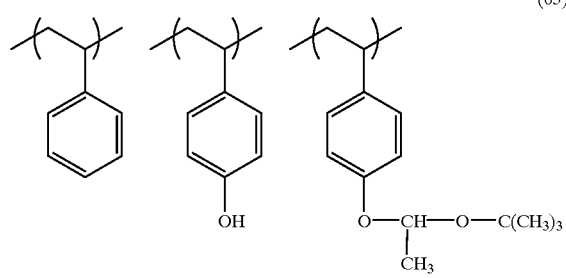
(66)
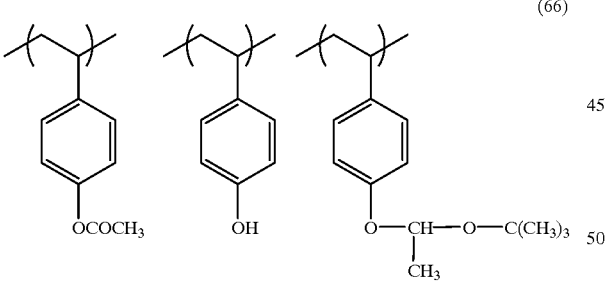
(67)
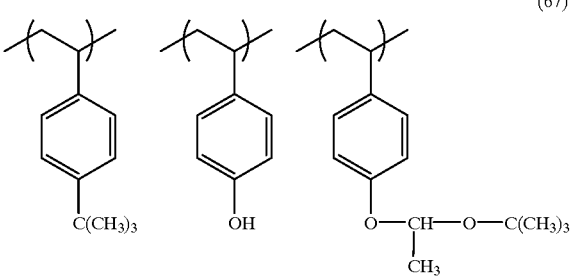
(68)
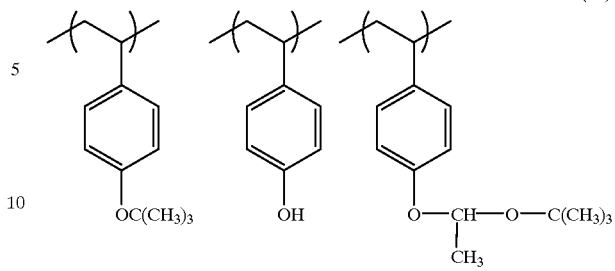
(69)
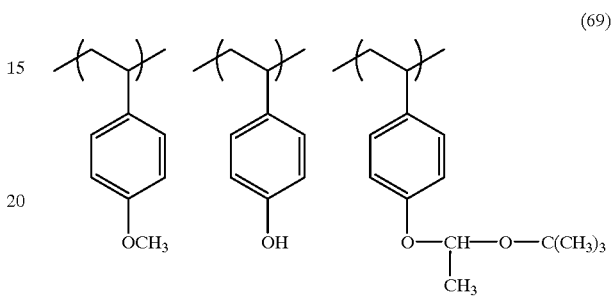
(70)
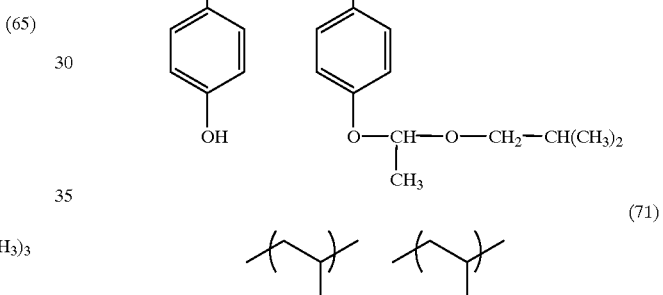
(71)
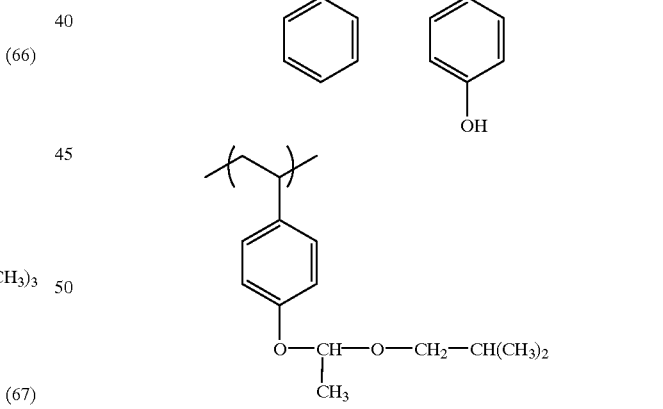
(72)
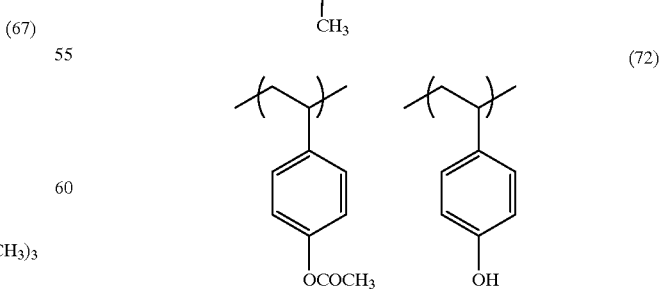

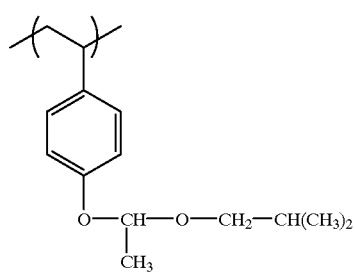
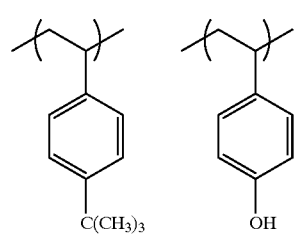
(73)
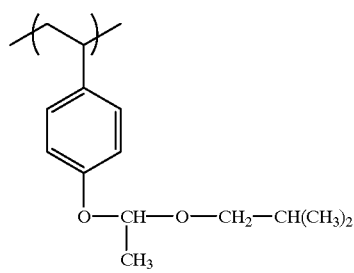
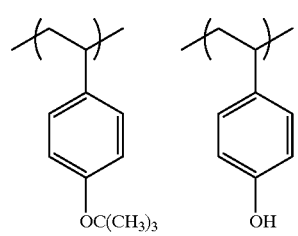
(74)
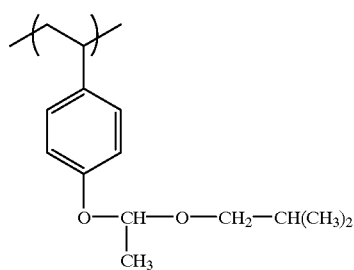
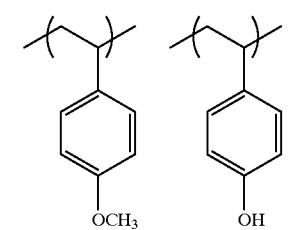
(75)
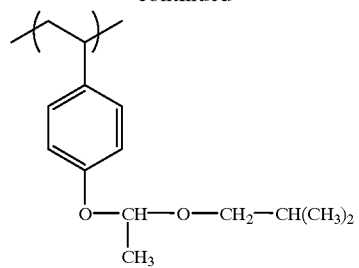
(76)
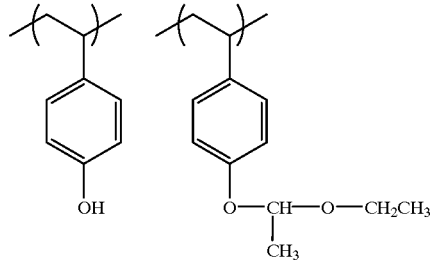
(77)
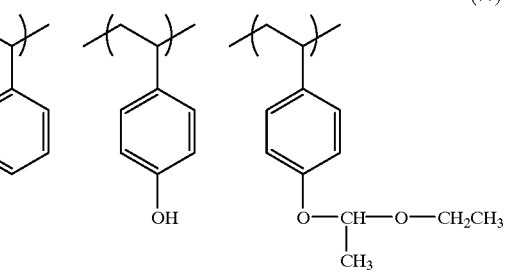
(78)
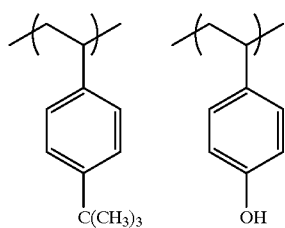
(79)
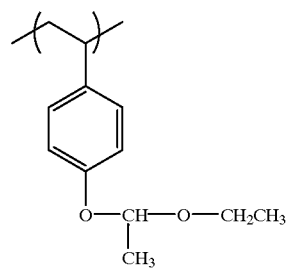

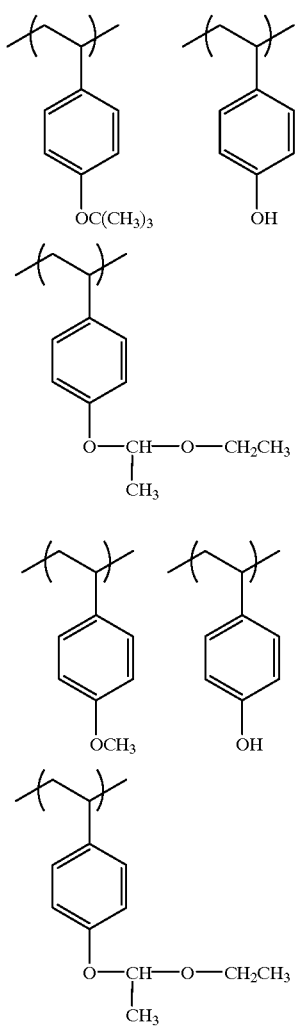

(80)

(81)

The photoresist composition according to the present invention can contain an organic basic compound. By the incorporation of an organic basic compound, the storage stability is improved and line width fluctuation due to PED is decreased. Preferred organic basic compounds which can be used in the present invention are compounds having stronger basicity than phenol. Nitrogen-containing compounds are preferred above all. Structures represented by the following formulae (A) to (E) can be exemplified as preferred chemical environment.

(A)

$$R^{250}\!-\!\underset{\underset{R^{252}}{|}}{\overset{\overset{R^{251}}{|}}{N}}\!-\!R^{252}$$

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms, or a substituted or unsubstituted aryl group having from 6 to 20 carbon atoms, and $R^{251}$ and $R^{252}$ may be bonded to each other to form a ring

  (B)

  (C)

  (D)

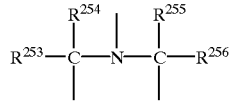  (E)

wherein $R^{253}$, $R^{254}$, $R^{255}$, and $R^{256}$, which may be the same or different, each represents an alkyl group having from 1 to 6 carbon atoms.

More preferred compounds are nitrogen-containing basic compounds having 2 or more nitrogen atoms of different chemical environments in one molecule, and particularly preferred compounds are those having both of a substituted or unsubstituted amino group and the ring structure containing a nitrogen atom, or those having an alkylamino group. Specific examples of preferred compounds include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine. Examples of preferred substituents include an amino group, an aminoalkyl group, an alkylamino group, an aminoaryl group, an arylamino group, an alkyl group, an alkoxyl group, an acyl group, an acyloxy group, an aryl group, an aryloxy group, a nitro group, a hydroxyl group and a cyano group.

Examples of particularly preferred compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, and N-aminomorpholine, N-(2-aminoethyl)morpholine, but the present invention is not limited to these compounds.

These nitrogen-containing basic compounds can be used alone or in combination of two or more. The addition amount of the nitrogen-containing basic compound is generally from 0.001 to 10 weight parts, preferably from 0.01 to 5 weight parts, per 100 weight parts of the photosensitive resin composition (excluding the solvent). If the content is less than 0.001 weight part, the effect of addition cannot be obtained. On the other hand, if it exceeds 10 weight parts, the sensitivity lowers and developing properties are deteriorated.

The positive photoresist composition according to the present invention can further contain a surfactant, a dye, a pigment, a plasticizer, a photosensitizer, a compound having two or more phenolic hydroxyl groups in order to accelerate the solubility of the composition in a developing solution, etc., if necessary.

Specific examples of surfactants preferably used in the present invention include nonionic surfactants such as polyoxyethylene alkyl ethers (e.g., polyoxyethylene lauryl ether, polyoxyethylene stearyl ether, polyoxyethylene cetyl ether, polyoxyethylene oleyl ether, etc.), polyoxyethylene alkylaryl ethers (e.g., polyoxyethylene octylphenol ether, polyoxyethylene nonylphenol ether, etc.), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate, etc.), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.); fluorine surfactants such as Eftop EF301, EF303, EF352 (Shin-Akita Chemical Co., Ltd.), Megafac F171, F173 (Dainippon Ink & Chemicals, Inc.), Florad FC430, FC431 (Sumitomo 3M Co., Limited), and Asahiguard AG710, Surfron S-382, SC101, SC102, SC103, SC104, SC105, SC106 (Asahi Glass Co., Ltd.); and organosiloxane polymer KP341 (Shin-Etsu Chemical Co., Ltd.), acrylic acid or methacrylic acid (co) polymers Polyflow No. 75, No. 95 (Kyoei-Sha Oils and Fats Chemical Industries Co., Ltd.).

These surfactants may be used alone or in combination of two or more thereof. The preferred addition amount is from 0.0005 to 0.01 weight part per 100 weight parts of the composition (excluding the solvent).

Preferred dyes are an oil dye and a basic dye. Specific examples of dyes include Oil Yellow #101, Oil Yellow #103, Oil Pink #312, Oil Green BG, Oil Blue BOS, Oil Blue #603, Oil Black BY, Oil Black BS, Oil Black T-505 (manufactured by Orient Chemical Co., Ltd.), Crystal Violet (C.I. 42555), Methyl Violet (C.I. 42535), Rhodamine B (C.I. 45170B), Malachite Green (C.I. 42000), and Methylene Blue (C.I. 52015).

By adding the following-exemplified spectral sensitizers, the longer wavelength region than far ultraviolet, where the light-acid generating agent to be used does not have absorption band, can be sensitized. As a result, the chemically amplifying type positive resist according to the present invention can have sensitivity at i-ray or g-ray. Specific examples of preferred spectral sensitizers include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzyl, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin, and coronene, but the present invention is not limited to these compounds.

As the compound having two or more phenolic hydroxyl groups in order to accelerate the solubility of the composition in a developing solution, a polyhydroxy compound can be exemplified. Preferred examples of polyhydroxy compounds useful for such a purpose include phenols, resorcinol, phloroglucinol, phloroglucide, 2,3,4-trihydroxybenzophenone, 2,3,4,4'-tetrahydroxybenzophenone, $\alpha,\alpha',\alpha''$-tris(4-hydroxyphenyl)-1,3,5-triisopropylbenzene, tris(4-hydroxyphenyl)methane, tris(4-hydroxyphenyl)ethane, and 1,1'-bis(4-hydroxyphenyl)cyclohexane.

The above-described components of the composition of the present invention are dissolved in a solvent and coated on a substrate (or a support). Examples of solvents preferably used in the present invention include ethylene dichloride, cyclohexanone, cyclopentanone, 2-heptanone, $\gamma$-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methylmethoxy propionate, ethylethoxy propionate, methyl pyruvate, ethyl pyruvate, propyl pyruvate, N,N-dimethylformamide, dimethyl sulfoxide, N-methylpyrrolidone, and tetrahydrofuran. These solvents can be used alone or in combination of two or more.

The above described positive photoresist composition of the present invention is coated by an appropriate coating means such as a spinner or a coater on a substrate commonly used in the production of precision integrated circuit elements (e.g., a silicon/silicon dioxide-coated substrate), exposed through a predetermined mask, pre-baked, and then subjected to development, thereby an excellent resist can be obtained.

The developing solution for the positive photoresist composition of the present invention include, e.g., alkaline aqueous solutions of inorganic alkalis such as sodium hydroxide, potassium hydroxide, sodium carbonate, sodium silicate, sodium phosphate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; amides such as formamide and acetamide; quaternary ammonium salts such as tetramethylammonium hydroxide, trimethyl(2-hydroxyethyl) ammonium hydroxide, tetraethylammonium hydroxide, tributylmethylammonium hydroxide, tetraethanolammonium hydroxide, methyltriethanolammonium hydroxide, benzylmethyldiethanolammonium hydroxide, benzyldimethylethanolammonium hydroxide, benzyltriethanolammonium hydroxide, tetrapropylammonium hydroxide, and tetrabutylammonium hydroxide; and cyclic amines such as pyrrole and piperidine.

The positive photoresist composition according to the present invention fundamentally comprises the above-described components (a), (b) and (c), but an alkali-soluble resin other than component (a) can be contained for the purpose of improving film property and heat resistance, etc. As such an alkalisoluble resin, polymers having an acidic hydrogen atom having pKa of 11 or less such as a phenolic hydroxyl group, a carboxylic acid group, a sulfonic acid group, animido group, a sulfonamido group, an N-sulfonylamido group, an N-sulfonylurethane group or an active methylene group are preferably used.

Preferred alkali-soluble polymers are novolak-phenol resins, specifically, phenol-formaldehyde resins, o-cresol-formaldehyde resins, m-cresol-formaldehyde resins, p-cresol-formaldehyde resins, xylenol-formaldehyde resins, or condensation products of these resins. As disclosed in JP-A-50-125806, condensation products of phenol or cresol, which is substituted with an alkyl group having from 3 to 8 carbon atoms, with formaldehyde, such as t-butylphenol-formaldehyde resins, can be used with the following phenol resins. Moreover, polymers containing phenolic hydroxyl group-containing monomer as a copolymer component, such as N-(4-hydroxyphenyl)methacrylamide, homopolymers or copolymers of p-hydroxystyrene, o-hydroxystyrene, m-isopropenylphenol, or p-isopropenylphenol, and partially esterified or etherified polymers of these polymers can also be used in the present invention.

When the resist comprising the positive photoresist composition according to the present invention is used as the upper layer resist of the two-layer resist, etching of the lower organic polymer layer by oxygen plasma is conducted using the upper layer resist pattern as the protective mask, and the upper layer resist has sufficient oxygen plasma resistance. Although the oxygen plasma resistance of the positive photoresist composition according to the present invention depends upon the silicon content of the upper layer resist., the etching apparatus, and the etching condition as well, the selection ratio of etching (the speed ratio of etching of the lower layer and upper layer resist) can be taken in a sufficiently broad range, such as from 10 to 100.

In the pattern-forming method by the positive photoresist composition according to the present invention, an organic polymer layer is formed in the first place on a substrate to be processed. Various kinds of well-known photoresists can be used for this organic polymer layer, for example, FH series and FHi series (manufactured by Fuji Photo Film Olin Co., Ltd.), OiR series (manufactured by Olin Co., Ltd.), and PFI series (manufactured by Sumitomo Chemical Co., Ltd.) can be exemplified. This organic polymer layer is formed by dissolving these photoresists in an appropriate solvent, and coating the obtained coating solution by spin coating or spray coating. Subsequently, the layer of the positive photoresist composition according to the present invention is formed on the above-obtained first organic polymer layer. The second layer is formed in the same procedure as the formation of the first layer, i.e., by dissolving the resist material in an appropriate solvent, and coating the obtained coating solution by spin coating or spray coating.

The thus-obtained second layer resist is then subjected to the pattern-forming process. As the first stage of the process, the second layer, i.e., the photoresist composition of the upper layer, is undergone pattern forming process. Mask alignment is performed, if necessary. By irradiating high energy radiation through the mask, the photoresist composition of the irradiated part becomes soluble in an alkaline aqueous solution, and a pattern is formed by development in an alkaline aqueous solution.

After that, etching of the organic polymer layer is performed as the second stage. This process is performed by oxygen plasma etching using the above pattern of the resist composition layer as the mask, thereby a highly precise pattern having a high aspect ratio can be formed. This etching of the organic polymer layer by oxygen plasma etching is completely the same technique as the plasma ashing utilized in peeling of a resist layer conducted after completion of etching process of a substrate by conventional photo-etching. This operation can be effected using oxygen as reactive gas,. i.e., etching gas, by a cylindrical plasma etching apparatus or a parallel plate type plasma etching apparatus.

Further, the substrate is processed using this resist pattern as a mask. Dry etching methods such as sputter etching, gas plasma etching and ion beam etching can be used for this processing.

Etching process by two-layer resist system including the resist layer of the present invention is completed by the peeling operation of the resist layer. The peeling of the resist layer can be performed merely by dissolving process of the organic polymer material of the first layer. The organic polymer material is an arbitrary photoresist and is not decomposed (cured) at all by the above-described photo-etching operation, therefore, each of well-known organic solvent of the photoresist itself can be used. Alternatively, peeling can be performed by processing such as plasma etching, etc., without using a solvent.

The present invention is explained in more detail with reference to the following synthesis examples, examples and comparative examples, but the present invention should not be construed as being limited thereto.

SYNTHESIS EXAMPLE 1

Synthesis of Polysiloxane C-5

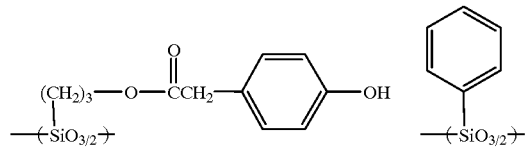

After 20 g of 3-chloropropyltrimethoxysilane was added to 200 ml of dried N,N-dimethylacetamide, 15.5 g of 4-hydroxyphenylacetic acid, 3.0 g of potassium iodide and 16.0 g of DBU (1,8-diazabicyclo[5.4.0]-7-undecene) were added thereto.

The mixture was allowed to react under dry nitrogen atmosphere at 70 to 90° C. for 5hours. The temperature of the reaction solution was lowered to room temperature. To the reaction solution were added 20 g of phenyltrimethoxysilane and 12.0 g of distilled water and the solution was allowed to react at 50° C. for 3 hours, followed by further reaction at 120° C. for 12 hours. The reaction solution was neutralized with dilute hydrochloric acid, and then poured into 2 liters of distilled water with stirring, thereby 49 g of a brown pasty polymer was recovered.

SYNTHESIS EXAMPLE 2

Synthesis of Polysiloxane C-58

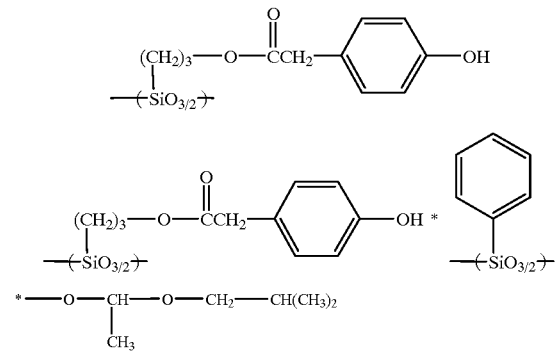

Twenty (20) grams of vacuum-dried Polysiloxane C-5 was dissolved in 100 ml of THF, then 3.3 g of i-butyl vinyl ether and 20 mg of p-toluenesulfonic acid monohydrate were added thereto, and the mixture was allowed to react at room temperature for 10 hours.

Triethylamine was added to the reaction solution to quench the reaction and the solution was poured into 2 liters of distilled water with stirring to precipitate a polymer, and the reaction system was dried under reduced pressure at room temperature, thereby 19 g of the objective Polysiloxane C-58 was obtained.

SYNTHESIS EXAMPLE 3

Synthesis of Polysiloxane C-50

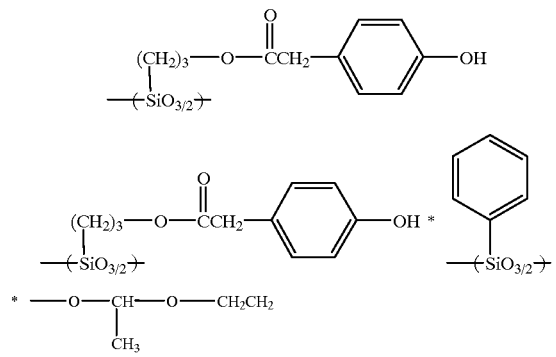

Chloromethyltrimethoxysilane (17.0 g) was added to 20 ml of dried N,N-dimethylacetamide, then 15.5 g of 4-hydroxyphenylacetic acid, 3.0 g of potassium iodide and 16.0 g of DBU were added thereto. The mixture was allowed to react under drynitrogenatmosphereat 70 to 90° C. for 5 hours. The temperature of the reaction solution was lowered to room temperature. To the reaction solution were added 20 g of phenyltrimethoxysilane and 12.0 g of distilled water and the solution was allowed to react at 50° C. for 3 hours, followed by further reaction at 120° C. for 12 hours. The reaction solution was neutralized with dilute hydrochloric acid, and then poured into 2 liters of distilled water with stirring, thereby a brown pasty polymer was recovered.

Twenty (20) grams of the vacuum-dried polymer was dissolved in 100 ml of THF, then 2.8 g of ethyl vinyl ether and 20 mg of p-toluenesulfonic acid monohydrate were added thereto, and the mixture was allowed to react at room temperature for 10 hours.

Triethylamine was added to the reaction solution to quench the reaction and the solution was poured into 2 liters of distilled water with stirring to precipitate a polymer, and the reaction system was dried under reduced pressure at room temperature, thereby 19 g of the objective Polysiloxane C-50 was obtained.

SYNTHESIS EXAMPLE 4

Synthesis of Polysiloxane C-70

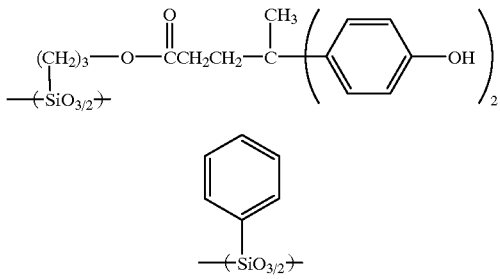

After 20 g of 3-chloropropyltrimethoxysilane was added to 200 ml of dried N,N-dimethylacetamide, 28.7 g of diphenolic acid, 3.0 g of potassium iodide and 16.0 g of DBU were added thereto. The mixture was allowed to react under dry nitrogen atmosphere at 70 to 90° C. for 5 hours. The temperature of the reaction solution was lowered to room temperature. To the reaction solution were added 30 g of phenyltrimethoxysilane and 14.5 g of distilled water and the solution was allowed to react at 50° C. for 3 hours, followed by further reaction at 120° C. for 12 hours. The reaction solution was neutralized with dilute hydrochloric acid, and then poured into 3 liters of distilled water with stirring, thereby 63 g of a white solid powder was obtained.

SYNTHESIS EXAMPLE 5

Synthesis of Polysiloxane C-80

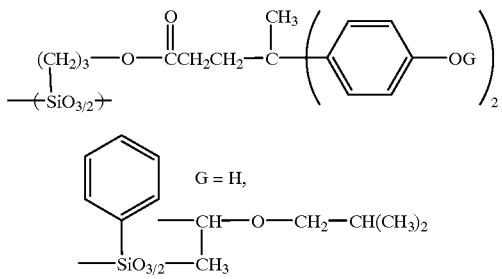

Twenty (20) grams of vacuum-dried white powder Polysiloxane C-70 was dissolved in 100 ml of THF, then 3.0 g of i-butyl vinyl ether and 20 mg of p-toluenesulfonic acid monohydrate were added thereto, and the mixture was allowed to react at room temperature for 10 hours.

Triethylamine was added to the reaction solution to quench the reaction and the solution was poured into 2 liters of distilled water with stirring to precipitate a polymer, and the reaction system was dried under reduced pressure at room temperature, thereby 18.7 g of the objective Polysiloxane C-80 was obtained.

SYNTHESIS EXAMPLE 6

Synthesis of Polysiloxane C-66

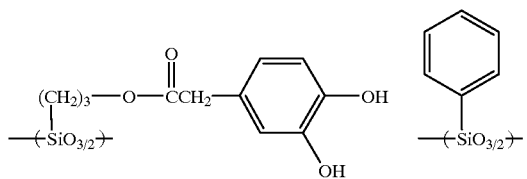

Chloromethyltrimethoxysilane (17.0 g) and 30.0 g of phenyltrimethoxysilane were added to 200 ml of dried N,N-dimethylacetamide, then 17 g of 3,4-dihydroxyphenylacetic acid, 3.0 g of potassium iodide and 16.0 g of DBU were added thereto. The mixture was allowed to react under dry nitrogen atmosphere at 70 to 90° C. for 5hours. The temperature of the reaction solution was lowered to room temperature. To the reaction solution was added 14.5 g of distilled water and the solution was allowed to react at 50° C. for 3 hours, followed by further reaction at 120° C. for 12 hours. The reaction solution was neutralized with dilute hydrochloric acid, and then poured into 3 liters of distilled water with stirring, thereby 52 g of a pale brown solid powder was obtained.

SYNTHESIS EXAMPLE 7

Synthesis of Polysiloxane C-92

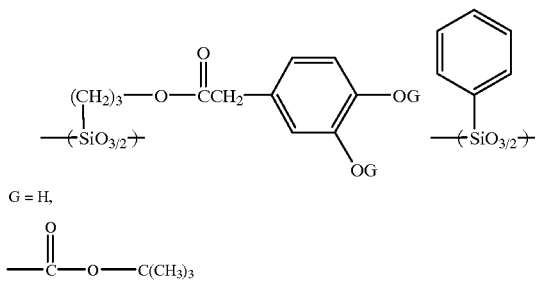

G = H, $$-\overset{O}{\underset{\parallel}{C}}-O-C(CH_3)_3$$

Twenty (20) grams of vacuum-dried Polysiloxane C-66 was dissolved in 100 ml of THF. After 2.8 g of di-t-butyl dicarbonate was added thereto, 1.3 g of triethylamine was dropwise added over 1 hour, and the mixture was allowed to react at room temperature for 10 hours. The reaction solution was poured into 2 liters of distilled water with stirring to precipitate a polymer, and dried under reduced pressure at room temperature, thereby 18.2 g of the objective Polysiloxane C-92 was obtained.

EXAMPLE 1

Two (2) grams of Polysiloxane C-58 as acid-decomposable polysiloxane (component (a)), 0.12 g of triphenylsulfonium -2,4,6-triisopropylphenylsulfonate as a compound which generates acid by exposure (component (b)), and 0.012 g of triphenylimidazole were dissolved in 19.2 g of propylene glycol monomethyl ether acetate, and the solution was thoroughly filtered through a 0.1 μm-membrane filter.

FHi-028D resist (resist for i-ray, manufactured by Fuji Photo Film Olin Co., Ltd.) was coated on a silicon wafer by means of a coater CDS-650 (manufactured by Canon Inc.), and baked at 90° C. for 90 seconds, thereby a uniform layer having a thickness of 0.83 μm was obtained. The layer was further heated at 200° C. for 3 minutes, as a result, the thickness of the layer was decreased to 0.71 μm. The above-prepared silicon-containing resist was coated thereon, baked at 90° C. for 90 seconds to obtain a layer thickness of 0.20 μm.

The thus-obtained wafer was subjected to exposure using KrF eximer laser stepper FPA-3000 EX3 (manufactured by Canon Inc.) equipped with a resolving power mask with varying the exposure amount and the focus. The exposed wafer was then heated at 120° C. for 90 seconds in a clean room, developed with a tetramethylammoniumhydroxide developing solution (2.38%) for 60 seconds, rinsed with distilled water, dried, and a pattern was obtained. The pattern was observed with a scanning electron microscope. It was revealed that line/space of 0.16 μm was resolved at sensitivity of 30 mJ/cm². The rectangular property of the cross section was graded A.

The rectangular property of the cross section was compared by three grade evaluation as follows. The angle formed by the substrate with the side wall of the resist pattern was measured. From 80° to 90° was graded A, 70° or higher and less than 80° was graded B, and less than 70° was graded C.

Further, the above wafer was subjected to etching with a parallel plate type reactive ion etching apparatus (manufactured by Ulvac Co., Ltd.) using oxygen as etching gas, with the conditions of pressure at 20 milli-Torr, applied power of 100 mW/cm² for 15 minutes. The result of etching was observed with a scanning electron microscope. The dimensional shift of the pattern of 0.16 μm was 0.005 μm.

EXAMPLES 2–14

Positive photoresists were prepared in the same manner as in Example 1 except that the acid-decomposable polysiloxane (component (a)) and the acid-generating compound (component (b)) used in Example 1 were replaced with the polysiloxane (component (a)) and component (b) shown in Table 1, and each positive photoresist was subjected to exposure, development and etching in the same manner as in Example 1 The properties of the resists obtained are summarized in Table 2.

EXAMPLE 15

A positive photoresist was prepared in the same manner as in Example 1 except for using 1.9 g of Polysiloxane C-57 as acid-decomposable siloxane (component (a)), 0.12 g of triphenylsulfonium-2,4,6-triisopropylphenylsulfonate as an acid-generating compound (component (b)), 0.012 g of triphenylimidazole, and 0.143 g of Compound (60) (wherein R represents —CH$_2$COOC(CH$_3$)$_3$) as component (c). Coating, exposure, development and etching were performed in the same manner as in Example 1, and the resist obtained was observed with a scanning electron microscope. The composition of the resist prepared is shown in Table 3 and the results of evaluation obtained are shown in Table 4.

EXAMPLES 16–28

Positive photoresists were prepared in the same manner as in Example 15 except that the acid-decomposable siloxane (component (a)), component (b), and component (c) used in Example 15 were replaced with the siloxane, component (b) and component (c) shown in Table 3, and each positive photoresist was subjected to exposure, development and etching in the same manner as in Example 15. The properties of the resists obtained are summarized in Table 4.

EXAMPLE 29

A positive photoresist was prepared in the same manner as in Example 1 except for using 1.6 g of Polysiloxane C-5 as alkali-soluble siloxane (component (a)), 0.12 g of triphenylsulfonium-2,4,6-triisopropylphenylsulfonate as an acid-generating compound (component (b)), 0.012 g of triphenylimidazole, and 0.4 g of Compound (60) (wherein R represents —CH$_2$COOC(CH$_3$)$_3$) as component (c). Coating, exposure, development and etching were performed in the same manner as in Example 1, and the resist obtained was observed with a scanning electron microscope. The composition of the resist prepared is shown in Table 5 and the results of evaluation obtained are shown in Table 6.

EXAMPLES 30–42

Positive photoresists were prepared in the same manner as in Example 29 except that the alkali-soluble siloxane (component (a)), component (b), and component (c) used in Example 29 were replaced with polysiloxane (component (a)), component (b), and component (c) shown in Table 5, and each positive photoresist was subjected to exposure, development and etching in the same manner as in Example 29. The properties of the resists obtained are summarized in Table 6.

COMPARATIVE EXAMPLE 1

A resist was prepared in the same manner as in Example 1 using Polysiloxane D-1 shown below in place of the polysiloxane used in Example 1. Coating, exposure, development and etching were performed in the same manner as in Example 1, and the resist obtained was observed with a scanning electron microscope in the same manner as in Example 1. The results of evaluation obtained are shown in Table 7.

COMPARATIVE EXAMPLE 2

A resist was prepared in the same manner as in Example 1 using Polysiloxane D-2 shown below in place of the polysiloxane used in Example 1. Coating, exposure, development and etching were performed in the same manner as in Example 1, and the resist obtained was observed with a scanning electron microscope in the same manner as in Example 1 The results of evaluation obtained are shown in Table 7.

COMPARATIVE EXAMPLE 3

A resist was prepared in the same manner as in Example 29 except that component (c) used in Example 29 was excluded. Coating, exposure, development and etching were performed in the same manner as in Example 1, and the resist obtained was observed with a scanning electron microscope in the same manner as in Example 1. The results of evaluation obtained are shown in Table 7.

Polysiloxanes D-1 and D-2 used in Comparative Examples 1 and 2 are shown below.

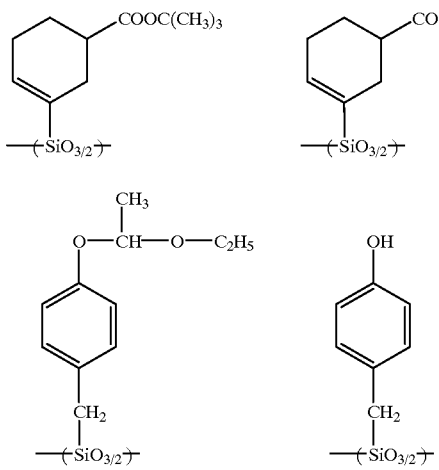

TABLE 1

| Example No. | Siloxane Polymer (component (a)) | Acid-Generating Compound (component (c)) |
| --- | --- | --- |
| 1 | C-58 | Triphenylsulfonium-2,4,6-triisopropylphenylsulfonate |

TABLE 1-continued

| Example No. | Siloxane Polymer (component (a)) | Acid-Generating Compound (component (c)) |
| --- | --- | --- |
| 2 | C-58 | Triphenylsulfonium pentafluorophenylsulfonate |
| 3 | C-51 | Triphenylsulfonium-2,4,6-triisopropylphenylsulfonate |
| 4 | C-51 | bis(p-t-Amylphenyl)-iodonium-p-toluenesulfonate |
| 5 | C-51 | Triphenylsulfonium-p-dodecylphenylsulfonate |
| 6 | C-59 | Triphenylsulfonium-2,4,6-triisopropylphenylsulfonate |
| 7 | C-61 | Triphenylsulfonium-2,4,6-triisopropylphenylsulfonate |
| 8 | C-50 | Triphenylsulfonium-2,4,6-triisopropylphenylsulfonate |
| 9 | C-54 | Triphenylsulfonium-2,4,6-triisopropylphenylsulfonate |
| 10 | C-37 | Triphenylsulfonium-2,4,6-triisopropylphenylsulfonate |
| 11 | C-52 | Triphenylsulfonium-2,4,6-triisopropylphenylsulfonate |
| 12 | C-23 | Triphenylsulfonium-2,4,6-triisopropylphenylsulfonate |
| 13 | C-80 | Triphenylsulfonium-2,4,6-triisopropylphenylsulfonate |
| 14 | C-92 | Triphenylsulfonium-2,4,6-triisopropylphenylsulfonate |

TABLE 2

| Example No. | Resolving Power ($\mu$m) | Sensitivity (mJ/cm$^2$) | Rectangular Property (observed by SEM) | Dimensional Shift after Etching ($\mu$m) |
| --- | --- | --- | --- | --- |
| 1 | 0.16 | 30 | A | 0.005 |
| 2 | 0.17 | 22 | A | 0.007 |
| 3 | 0.16 | 32 | A | 0.004 |
| 4 | 0.16 | 34 | A | 0.006 |
| 5 | 0.15 | 32 | A | 0.004 |
| 6 | 0.16 | 35 | A | 0.007 |
| 7 | 0.17 | 38 | A | 0.008 |
| 8 | 0.16 | 33 | A | 0.007 |
| 9 | 0.15 | 32 | B | 0.005 |
| 10 | 0.18 | 32 | A | 0.005 |
| 11 | 0.16 | 29 | A | 0.006 |
| 12 | 0.16 | 34 | A | 0.006 |
| 13 | 0.16 | 30 | A | 0.005 |
| 14 | 0.16 | 31 | A | 0.006 |

TABLE 3

| Example No. | Siloxane Polymer (component (a)) | Component (c) | Addition amount of Component (c) (wt %, based on component (a)) | Acid-Generating Compound (component (c)) |
|---|---|---|---|---|
| 15 | C-57 | Compound (60) R: —CH$_2$COOC(CH$_3$)$_3$ | 7.5 | Triphenylsulfonium-2,4,6-triisopropylphenylsulfonate |
| 16 | C-57 | Compound (60) R: —CH$_2$COOC(CH$_3$)$_3$ | 15 | Triphenylsulfonium-2,4,6-triisopropylphenylsulfonate |
| 17 | C-57 | Compound (60) R: —CH$_2$COOC(CH$_3$)$_3$ | 2 | Triphenylsulfonium-2,4,6-triisopropylphenylsulfonate |
| 18 | C-57 | Compound (60) R: —CH$_2$COOC(CH$_3$)$_3$ | 10 | Triphenylsulfonium pentafluorophenylsulfonate |
| 19 | C-57 | Compound (72) | 10 | Triphenylsulfonium-2,4,6-triisopropylphenylsulfonate |
| 20 | C-51 | Compound (60) R: —CH$_2$COOC(CH$_3$)$_3$ | 10 | Triphenylsulfonium-2,4,6-triisopropylphenylsulfonate |
| 21 | C-51 | Compound (70) | 15 | Triphenylsulfonium-2,4,6-triisopropylphenylsulfonate |
| 22 | C-51 | Compound (18) R: —CH$_2$COOC(CH$_3$)$_3$ | 10 | Triphenylsulfonium-2,4,6-triisopropylphenylsulfonate |
| 23 | C-58 | Compound (60) R: —CH$_2$COOC(CH$_3$)$_3$ | 7.5 | Triphenylsulfonium-2,4,6-triisopropylphenylsulfonate |
| 24 | C-58 | Compound (60) R: —CH$_2$COOC(CH$_3$)$_3$ | 1.5 | Triphenylsulfonium-p-dodecylphenylsulfonate |
| 25 | C-61 | Compound (73) | 7.5 | Triphenylsulfonium-2,4,6-triisopropylphenylsulfonate |
| 26 | C-50 | Compound (60) R: —CH$_2$COOC(CH$_3$)$_3$ | 7.5 | Triphenylsulfonium-2,4,6-triisopropylphenylsulfonate |
| 27 | C-80 | Compound (60) R: —CH$_2$COOC(CH$_3$)$_3$ | 7.5 | Triphenylsulfonium-2,4,6-triisopropylphenylsulfonate |
| 28 | C-92 | Compound (60) R: —CH$_2$COOC(CH$_3$)$_3$ | 7.5 | Triphenylsulfonium-2,4,6-triisopropylphenylsulfonate |

TABLE 4

| Example No. | Resolving Power ($\mu$m) | Sensitivity (mJ/cm$^2$) | Rectangular Property (observed by SEM) | Dimensional Shift after Etching ($\mu$m) |
|---|---|---|---|---|
| 15 | 0.15 | 33 | A | 0.005 |
| 16 | 0.18 | 28 | B | 0.007 |
| 17 | 0.19 | 32 | B | 0.011 |
| 18 | 0.17 | 25 | A | 0.006 |
| 19 | 0.16 | 31 | A | 0.004 |
| 20 | 0.16 | 32 | A | 0.007 |
| 21 | 0.17 | 33 | B | 0.012 |
| 22 | 0.17 | 30 | A | 0.007 |
| 23 | 0.15 | 32 | B | 0.005 |
| 24 | 0.19 | 34 | B | 0.010 |
| 25 | 0.17 | 33 | A | 0.006 |
| 26 | 0.15 | 30 | A | 0.006 |
| 27 | 0.16 | 30 | A | 0.007 |
| 28 | 0.17 | 33 | B | 0.008 |

TABLE 5

| Example No. | Siloxane Polymer (component (a)) | Component (c) | Addition amount of Component (c) (wt %, based on component (a)) | Acid-Generating Compound (component (c)) |
|---|---|---|---|---|
| 29 | C-5 | Compound (60) R: —CH$_2$COOC(CH$_3$)$_3$ | 25 | Triphenylsulfonium-2,4,6-triisopropylphenylsulfonate |
| 30 | C-5 | Compound (18) R: —CH$_2$COOC(CH$_3$)$_3$ | 25 | Triphenylsulfonium-2,4,6-triisopropylphenylsulfonate |
| 31 | C-6 | Compound (60) R: —CH$_2$COOC(CH$_3$)$_3$ | 25 | Triphenylsulfonium-2,4,6-triisopropylphenylsulfonate |
| 32 | C-6 | Compound (60) R: —CH$_2$COOC(CH$_3$)$_3$ | 40 | Triphenylsulfonium-2,4,6-triisopropylphenylsulfonate |
| 33 | C-6 | Compound (60) R: —CH$_2$COOC(CH$_3$)$_3$ | 10 | Triphenylsulfonium-2,4,6-triisopropylphenylsulfonate |
| 34 | C-6 | Compound (60) R: —CH$_2$COOC(CH$_3$)$_3$ | 25 | Triphenylsulfonium pentafluorophenylsulfonate |
| 35 | C-6 | Compound (72) | 25 | Triphenylsulfonium-2,4,6-triisopropylphenylsulfonate |

TABLE 5-continued

| Example No. | Siloxane Polymer (component (a)) | Component (c) | Addition amount of Component (c) (wt %, based on component (a)) | Acid-Generating Compound (component (c)) |
|---|---|---|---|---|
| 36 | C-1 | Compound (60) R: —CH₂COOC(CH₃)₃ | 25 | Triphenylsulfonium pentafluorophenylsulfonate |
| 37 | C-2 | Compound (18) R: —CH₂COOC(CH₃)₃ | 25 | Triphenylsulfonium-p-dodecylphenylsulfonate |
| 38 | C-2 | Compound (60) R: —CH₂COOC(CH₃)₃ | 45 | Triphenylsulfonium-2,4,6-triisopropylphenylsulfonate |
| 39 | C-6 | Compound (70) | 25 | Triphenylsulfonium-2,4,6-triisopropylphenylsulfonate |
| 40 | C-6 | Compound (60) R: —CH₂COOC(CH₃)₃ | 8 | Triphenylsulfonium-2,4,6-triisopropylphenylsulfonate |
| 41 | C-70 | Compound (60) R: —CH₂COOC(CH₃)₃ | 10 | Triphenylsulfonium-2,4,6-triisopropylphenylsulfonate |
| 42 | C-66 | Compound (60) R: —CH₂COOC(CH₃)₃ | 15 | Triphenylsulfonium-2,4,6-triisopropylphenylsulfonate |

TABLE 6

| Example No. | Resolving Power (μm) | Sensitivity (mJ/cm²) | Rectangular Property (observed by SEM) | Dimensional Shift after Etching (μm) |
|---|---|---|---|---|
| 29 | 0.16 | 31 | A | 0.005 |
| 30 | 0.17 | 35 | A | 0.007 |
| 31 | 0.16 | 32 | A | 0.011 |
| 32 | 0.15 | 29 | B | 0.011 |
| 33 | 0.17 | 30 | B | 0.012 |
| 34 | 0.15 | 26 | A | 0.005 |
| 35 | 0.16 | 33 | A | 0.007 |
| 36 | 0.17 | 25 | A | 0.006 |
| 37 | 0.16 | 30 | A | 0.006 |
| 38 | 0.17 | 30 | B | 0.009 |
| 39 | 0.17 | 36 | A | 0.006 |
| 40 | 0.18 | 33 | B | 0.012 |
| 41 | 0.18 | 35 | B | 0.010 |
| 42 | 0.18 | 36 | B | 0.011 |

TABLE 7

| Comparative Example No. | Resolving Power (μm) | Sensitivity (mJ/cm²) | Rectangular Property (observed by SEM) | Dimensional Shift after Etching (μm) |
|---|---|---|---|---|
| 1 | 0.22 | 36 | B | 0.020 |
| 2 | 0.19 | 35 | C | 0.012 |
| 3 | 0.20 | 38 | C | 0.011 |

From the results shown in Tables 2, 4, 6 and 7, it is apparent that the positive photoresist compositions according to the present invention in which the polysiloxanes according to the present invention are used provide photoresists having high resolving power, good rectangular property, small dimensional shift after etching, and these properties are well balanced as well.

On the other hand, the resists in Comparative Examples 1 and 2, wherein the polysiloxane according to the present invention is not used, are inferior in the balance of these properties. The resist of Comparative Example 3, wherein the polysiloxane according to the present invention is used but component (c) is not used, is also inferior in the balance of these properties.

EFFECT OF THE INVENTION

The positive photoresist compositions according to the present invention in which the polysiloxanes according to the present invention are used provide photoresists having high sensitivity, high resolving power, and good rectangular property. In addition, when the resist comprising the positive photoresist composition according to the present invention is used as the upper layer resist of the two-layer resist and pattern transfer to the lower layer is conducted by oxygen system plasma etching process, a highly precise pattern showing little dimensional shift and high aspect ratio can be obtained.

While the invention has been described in detail and with reference to specific example thereof, it will be apparent to one skilled in the art that various changes and modifications can be made therein without departing from the spirit and scope thereof.

What is claimed is:

1. A positive photoresist composition comprising (a) an acid-decomposable polysiloxane having a structural unit represented by formula (IV)

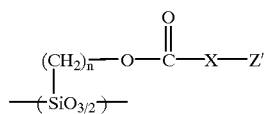

(IV)

wherein n represents an integer of from 1 to 6; X represents a single bond or a divalent linking group; and Z' represents a monovalent group selected from the group consisting of the groups represented by the following formula (V-1) and (V-2):

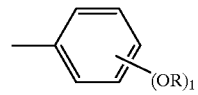

(V-1)

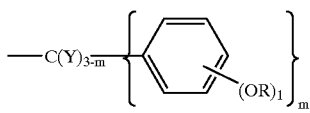
(V-2)

wherein R represents an acid-decomposable group; Y represents a hydrogen atom, a straight chain, branched or cyclic alkyl group, an aryl group, or an aralkyl group; l represents an integer of from 1 to 3; and m represents an integer of from 1 to 3, and (b) a compound which is decomposed by exposure to generate an acid.

2. The positive photoresist composition as claimed in claim 1, which further contains (c) (c1) a phenolic compound having in the molecule a phenolic hydroxyl group at least a part of which is protected by an acid-decomposable group, or (c2) an aromatic or aliphatic carboxylic acid compound having in the molecule a carboxyl group at least a part of which is protected by an acid-decomposable group.

* * * * *